(12) United States Patent
Itsumi et al.

(10) Patent No.: US 10,950,655 B2
(45) Date of Patent: Mar. 16, 2021

(54) TRANSDUCER AND INSPECTION DEVICE

(71) Applicant: Kabushiki Kaisha Toshiba, Minato-ku (JP)

(72) Inventors: Kazuhiro Itsumi, Koto (JP); Tomio Ono, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 517 days.

(21) Appl. No.: 15/909,472

(22) Filed: Mar. 1, 2018

(65) Prior Publication Data

US 2019/0088710 A1 Mar. 21, 2019

(30) Foreign Application Priority Data

Sep. 20, 2017 (JP) .............. JP2017-180598

(51) Int. Cl.
*H01L 27/20* (2006.01)
*B06B 1/06* (2006.01)
(Continued)

(52) U.S. Cl.
CPC .......... *H01L 27/20* (2013.01); *B06B 1/0622* (2013.01); *B06B 1/0662* (2013.01); *G01N 29/11* (2013.01); *G01N 29/2437* (2013.01); *G01N 29/27* (2013.01); *G07D 7/08* (2013.01); *G07D 7/189* (2017.05); *G10K 11/26* (2013.01); *H01L 41/0472* (2013.01); *G01N 2291/0237* (2013.01); *G01N 2291/048* (2013.01); *G01N 2291/106* (2013.01); *G01N 2291/2632* (2013.01)

(58) Field of Classification Search
CPC .... H01L 27/20; G07D 7/08; G01N 2291/106; G01N 29/2437; G01N 29/27
See application file for complete search history.

(56) References Cited

U.S. PATENT DOCUMENTS

| 4,066,969 A | 1/1978 | Pearce et al. |
| 6,984,922 B1 | 1/2006 | Nagahara et al. |

(Continued)

FOREIGN PATENT DOCUMENTS

| CN | 104271266 A | 7/2015 |
| CN | 104756521 A | 7/2015 |

(Continued)

*Primary Examiner* — Bryan P Gordon
(74) *Attorney, Agent, or Firm* — Oblon, McClelland, Maier & Neustadt, L.L.P.

(57) ABSTRACT

According to one embodiment, a transducer includes first structure sections and second structure sections. The first structure sections are spaced from each other in a first direction. Part of each of the first structure sections is fixed. The each of the first structure sections includes a first membrane part, a first piezoelectric part, a first conductive part, and a first electrode. The second structure sections are spaced from each other in the first direction. Part of each of the second structure sections is fixed. The each of the second structure sections includes a second membrane part, a second piezoelectric part, a second conductive part, and a second electrode. The second structure sections are spaced from the first structure sections in the first direction. Pitch along the first direction of the second structure sections is shorter than pitch along the first direction of the first structure sections.

17 Claims, 15 Drawing Sheets

(51) Int. Cl.
*G10K 11/26* (2006.01)
*G01N 29/11* (2006.01)
*G07D 7/08* (2006.01)
*H01L 41/047* (2006.01)
*G01N 29/27* (2006.01)
*G01N 29/24* (2006.01)
*G07D 7/189* (2016.01)

(56) References Cited

U.S. PATENT DOCUMENTS

| | | | |
|---|---|---|---|
| 2007/0282543 A1* | 12/2007 | Hiyama | G01N 29/28 |
| | | | 702/39 |
| 2008/0203654 A1 | 8/2008 | Chujo et al. | |
| 2012/0061901 A1 | 3/2012 | Yamamoto et al. | |
| 2013/0293065 A1* | 11/2013 | Hajati | B06B 1/0629 |
| | | | 310/334 |
| 2014/0117812 A1* | 5/2014 | Hajati | H01L 41/331 |
| | | | 310/314 |
| 2014/0269204 A1* | 9/2014 | Hajati | G01S 7/521 |
| | | | 367/135 |
| 2017/0320093 A1* | 11/2017 | Chatterjee | B06B 1/0238 |
| 2018/0117631 A1* | 5/2018 | Stranford | H01L 41/0474 |

FOREIGN PATENT DOCUMENTS

| | | |
|---|---|---|
| DE | 10 2015 009 899 A1 | 2/2017 |
| JP | 52-40379 | 3/1977 |
| JP | 2001-25094 A | 1/2001 |
| JP | 2004-72755 | 3/2004 |
| JP | 2008-207885 | 9/2008 |
| JP | 5178599 | 4/2013 |
| JP | 5214757 | 6/2013 |
| JP | 2014-195495 A | 10/2014 |
| WO | WO 2008/081183 A1 | 7/2008 |

\* cited by examiner

TRANSDUCER AND INSPECTION DEVICE

CROSS-REFERENCE TO RELATED APPLICATIONS

This application is based upon and claims the benefit of priority from Japanese Patent Application No. 2017-180598, filed on Sep. 20, 2017; the entire contents of which are incorporated herein by reference.

FIELD

Embodiments described herein relate generally to a transducer and an inspection device.

BACKGROUND

A transducer converts e.g. an acoustic wave to an electrical signal. A sensor based on the transducer is used to make determination (such as inspection) of sheets of paper (e.g. bank bills). A transducer with high resolution is desired.

DETAILED DESCRIPTION

Figure 1A:
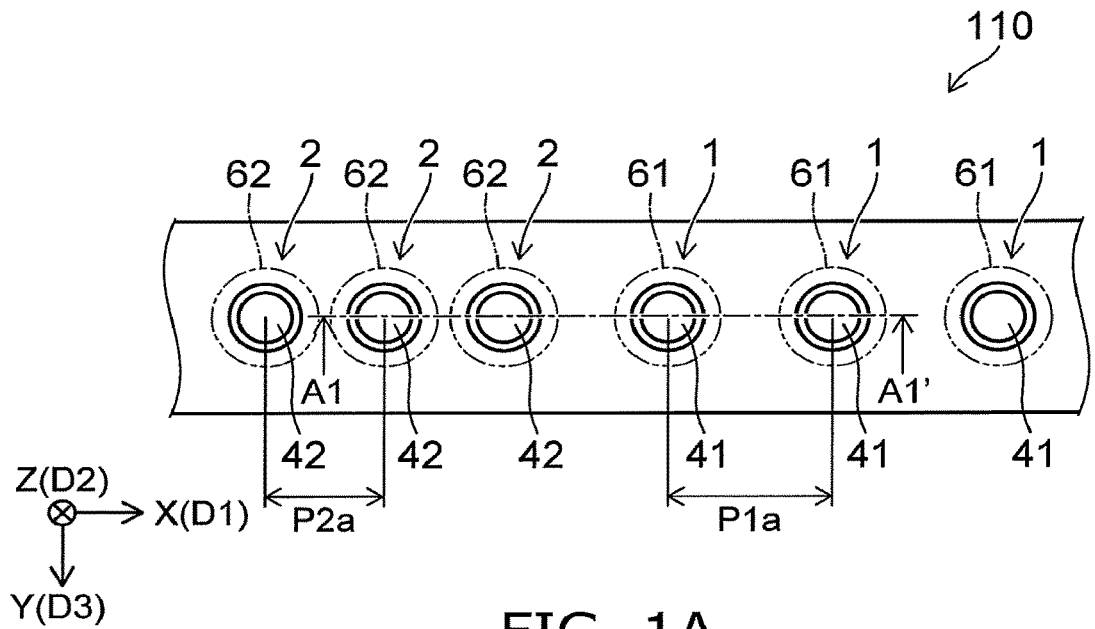
FIGS. 1A and 1B are schematic views illustrating a transducer according to a first embodiment.

According to one embodiment, a transducer includes a plurality of first structure sections and a plurality of second structure sections. The plurality of first structure sections are spaced from each other in a first direction. Part of each of the plurality of first structure sections is fixed. The each of the plurality of first structure sections includes a first membrane part, a first piezoelectric part, a first conductive part, and a first electrode. The first conductive part is provided between at least part of the first membrane part and the first piezoelectric part in a second direction crossing the first direction. At least part of the first piezoelectric part is located between at least part of the first conductive part and the first electrode in the second direction. The plurality of second structure sections are spaced from each other in the first direction. Part of each of the plurality of second structure sections is fixed. The each of the plurality of second structure sections includes a second membrane part, a second piezoelectric part, a second conductive part, and a second electrode. The second conductive part is provided between at least part of the second membrane part and the second piezoelectric part in the second direction. At least part of the second piezoelectric part is located between at least part of the second conductive part and the second electrode in the second direction. The plurality of second structure sections are spaced from the plurality of first structure sections in the first direction. Pitch along the first direction of the plurality of second structure sections is shorter than pitch along the first direction of the plurality of first structure sections.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

Figure 1B:
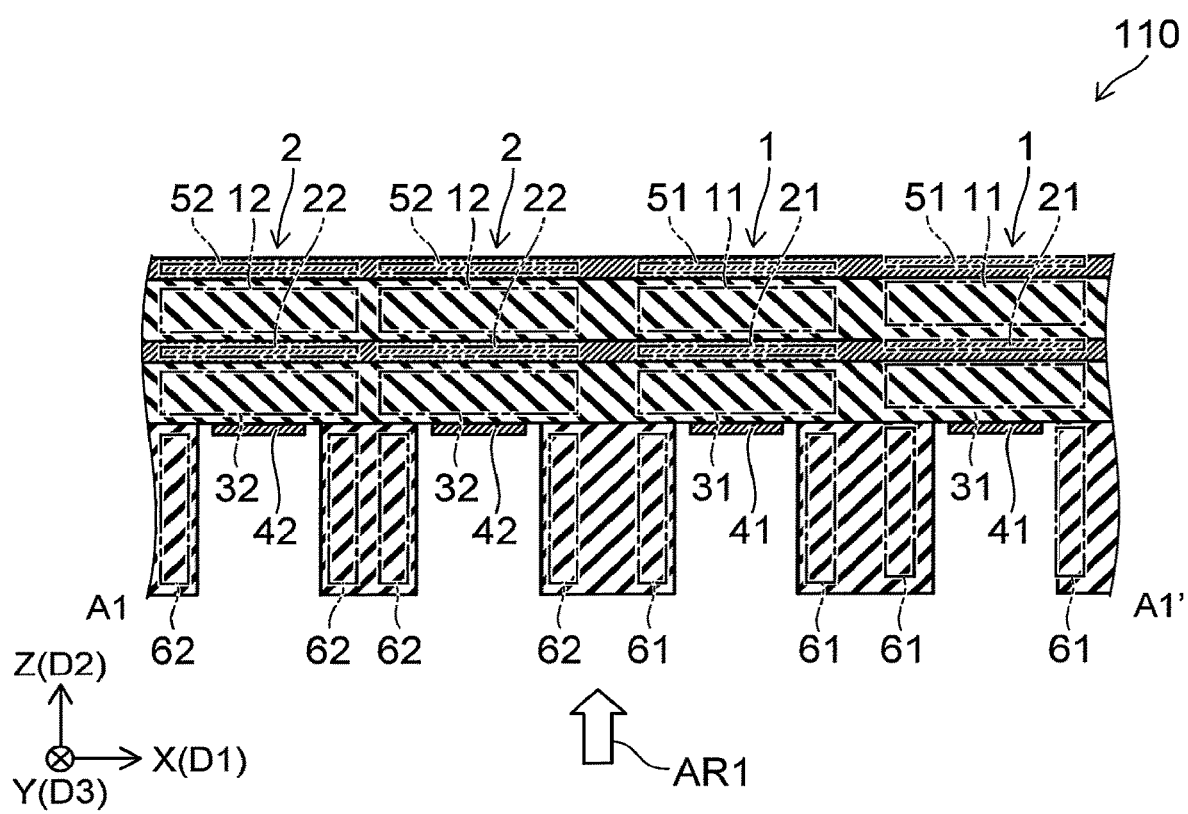

FIGS. 1A and 1B are schematic views illustrating a transducer according to a first embodiment.

FIG. 1A is a plan view as viewed in the direction of arrow AR1 of FIG. 1B. FIG. 1B is a sectional view taken along line A1-A1' of FIG. 1A.

As shown in FIGS. 1A and 1B, the transducer 110 includes a plurality of first structure sections 1 and a plurality of second structure sections 2.

The plurality of first structure sections 1 are spaced from each other in a first direction D1. The plurality of second structure sections 2 are spaced from each other in the first direction D1. The plurality of second structure sections 2 are spaced from the plurality of first structure sections 1 in the first direction D1.

The first direction D1 lies along e.g. the X-direction shown in FIGS. 1A and 1B. A second direction D2 is defined as a direction crossing the first direction D1. The second direction D2 lies along e.g. the Z-direction shown in FIGS. 1A and 1B. A third direction D3 is defined as a direction crossing the plane including the first direction D1 and the second direction D2. The third direction D3 lies along e.g. the Y-direction shown in FIGS. 1A and 1B.

In the following description, it is assumed that the first direction D1, the second direction D2, and the third direction D3 lie along the X-direction, the Z-direction, and the Y-direction, respectively.

The plurality of first structure sections 1 and the plurality of second structure sections 2 are arranged along e.g. the X-direction. The direction from the plurality of second structure sections 2 to the plurality of first structure sections 1 lies along e.g. the X-direction.

Each of the plurality of first structure sections 1 includes a first membrane part 11, a first conductive part 21, a first piezoelectric part 31, and a first electrode 41. In the example shown in FIGS. 1A and 1B, each of the plurality of first structure sections 1 further includes a first opposite conductive part 51.

The first membrane part 11 is provided between the first conductive part 21 and the first opposite conductive part 51 in the Z-direction. The first conductive part 21 is provided between the first membrane part 11 and the first piezoelectric part 31 in the Z-direction. Part of the first piezoelectric part 31 is provided between part of the first conductive part 21 and the first electrode 41 in the Z-direction.

Each of the plurality of second structure sections 2 includes a second membrane part 12, a second conductive part 22, a second piezoelectric part 32, and a second electrode 42. In the example shown in FIGS. 1A and 1B, each of the plurality of second structure sections 2 further includes a second opposite conductive part 52.

The second membrane part 12 is provided between the second conductive part 22 and the second opposite conductive part 52 in the Z-direction. The second conductive part 22 is provided between the second membrane part 12 and the second piezoelectric part 32 in the Z-direction. Part of the second piezoelectric part 32 is provided between part of the second conductive part 22 and the second electrode 42 in the Z-direction. The thickness (Z-direction length) of the second piezoelectric part 32 is e.g. equal to the thickness of the first piezoelectric part 31.

Part of each of the plurality of first structure sections 1 and part of each of the plurality of second structure sections 2 are fixed. For instance, as shown in FIGS. 1A and 1B, the transducer 110 further includes a plurality of first support parts 61 and a plurality of second support parts 62. The direction from the plurality of first support parts 61 to the plurality of first structure sections 1 lies along the Z-direction. The direction from the plurality of second support parts 62 to the plurality of second structure sections 2 lies along the Z-direction. Part of the first structure section 1 overlaps the first support part 61 in the Z-direction. Part of the second structure section 2 overlaps the second support part 62 in the Z-direction.

As shown in FIG. 1A, the pitch P2a along the X-direction of the plurality of second structure sections 2 is shorter than the pitch P1a along the X-direction of the plurality of first structure sections 1.

The pitch P1a is equal to e.g. the distance along the X-direction between the X-direction center of one of a plurality of first electrodes 41 and the X-direction center of a different one of the plurality of first electrodes 41. The different one of the plurality of first electrodes 41 is located next to the one of the plurality of first electrodes 41 in the X-direction.

The pitch P2a is equal to e.g. the X-direction distance between the X-direction center of one of a plurality of second electrodes 42 and the X-direction center of a different one of the plurality of second electrodes 42. The different one of the plurality of second electrodes 42 is located next to the one of the plurality of second electrodes 42 in the X-direction.

The transducer can be used to inspect e.g. a piece of paper (e.g. a bank bill). The transducer receives e.g. an acoustic wave transmitted through the paper and converts it to an electrical signal. In some cases, the paper is repaired by affixing a strip of tape on a portion of the paper. The acoustic wave transmitted through the portion of the paper affixed with the tape is attenuated relative to the acoustic wave transmitted through the other portion of the paper. The transducer can be used to detect an acoustic wave transmitted through the paper and to inspect whether foreign matter such as tape is attached on the paper. The accuracy of inspection is often lower at the edge of the paper than at the center of the paper. This results from e.g. the acoustic wave incident on the transducer around the paper without traveling through the paper.

In the transducer 110 according to the first embodiment, the pitch P2a along the X-direction of the plurality of second structure sections 2 is shorter than the pitch P1a along the X-direction of the plurality of first structure sections 1. This can improve the resolution in the plurality of second structure sections 2. For instance, the neighborhood of the X-direction edge of the paper is inspected by the plurality of second structure sections 2. Thus, foreign matter attached to the paper can be detected with higher accuracy.

In the transducer 110 according to the first embodiment, the pitch P1a is longer than the pitch P2a. This can reduce the number of interconnects connected to the plurality of first structure sections 1. As a result, for instance, the structure of the inspection device including the transducer 110 can be simplified. For instance, the processing speed of the inspection device including the transducer 110 can be improved.

Figure 2A:
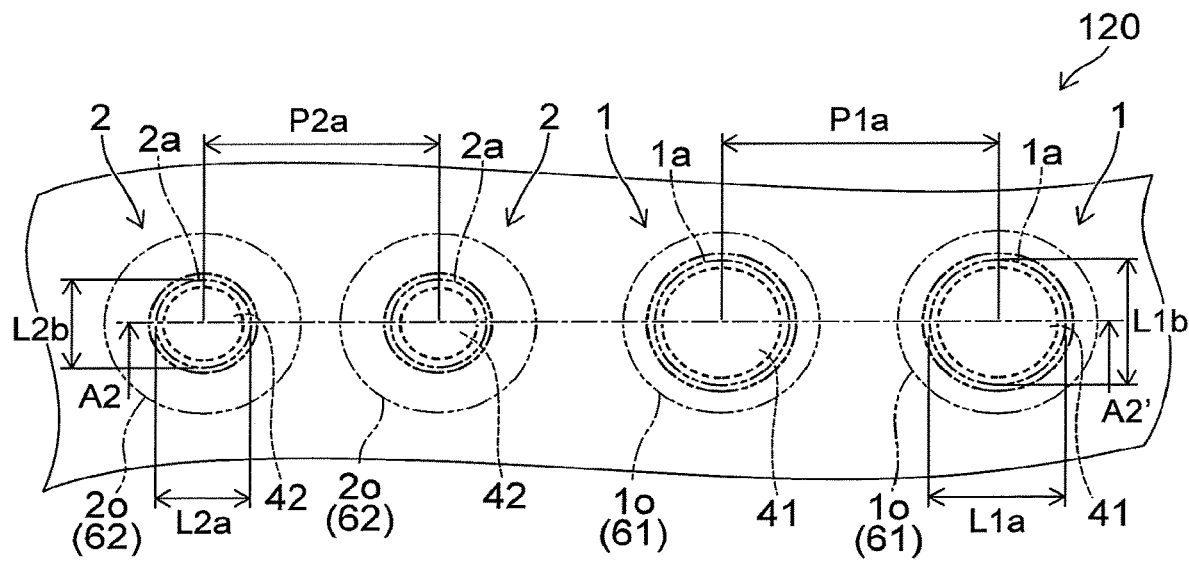
FIGS. 2A and 2B are schematic views illustrating a transducer according to the first embodiment.
Figure 2B:
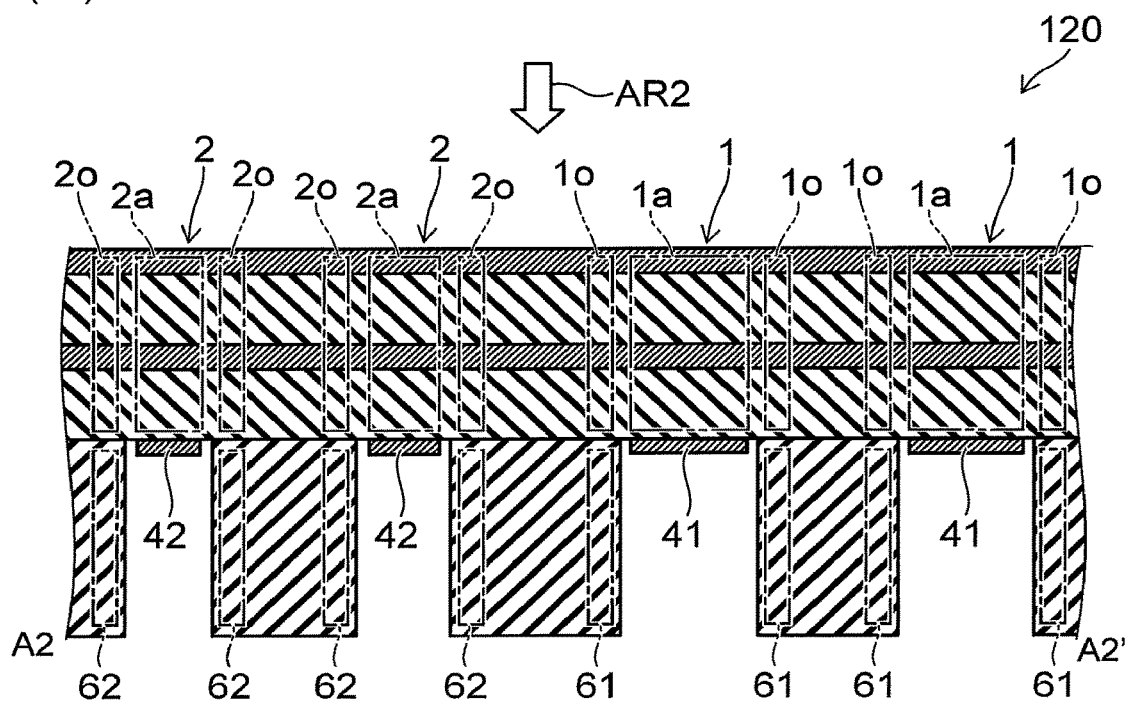

FIGS. 2A and 2B are schematic views illustrating a transducer according to the first embodiment.

FIG. 2A is a plan view as viewed in the direction of arrow AR2 of FIG. 2B. FIG. 2B is a sectional view taken along line A2-A2' of FIG. 2A.

In the transducer 120 shown in FIGS. 2A and 2B, the first structure section 1 includes a first region 1a and a first overlapping region 1o. The first region 1a does not overlap the first support part 61 in the Z-direction. The first overlapping region 1o overlaps the first support part 61 in the Z-direction. The direction from the first region 1a to the first overlapping region 1o lies along a plane crossing the Z-direction.

The second structure section 2 includes a second region 2a and a second overlapping region 2o. The second region 2a does not overlap the second support part 62 in the Z-direction. The second overlapping region 20 overlaps the second support part 62 in the Z-direction. The direction from the second region 2a to the second overlapping region 20 lies along a plane crossing the Z-direction.

As shown in FIG. 2A, the length L2a along the X-direction of the second region 2a is shorter than the length L1a along the X-direction of the first region 1a. The length L2b along the Y-direction of the second region 2a is shorter than the length L1b along the Y-direction of the first region 1a. The pitch P2a along the X-direction of the plurality of second structure sections 2 is e.g. shorter than the pitch P1a along the X-direction of the plurality of first structure sections 1.

This transducer 120 can further improve e.g. the resolution in the plurality of second structure sections 2.

Figure 3A:
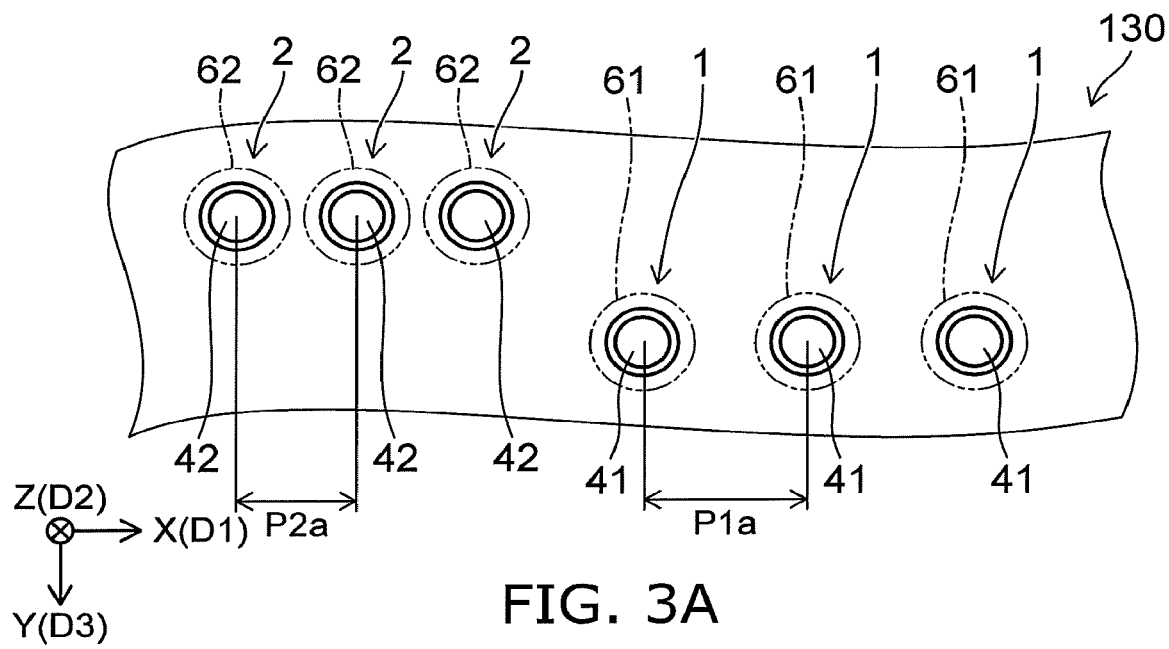
FIGS. 3A and 3B are schematic plan views illustrating alternative transducers according to the first embodiment.
Figure 3B:
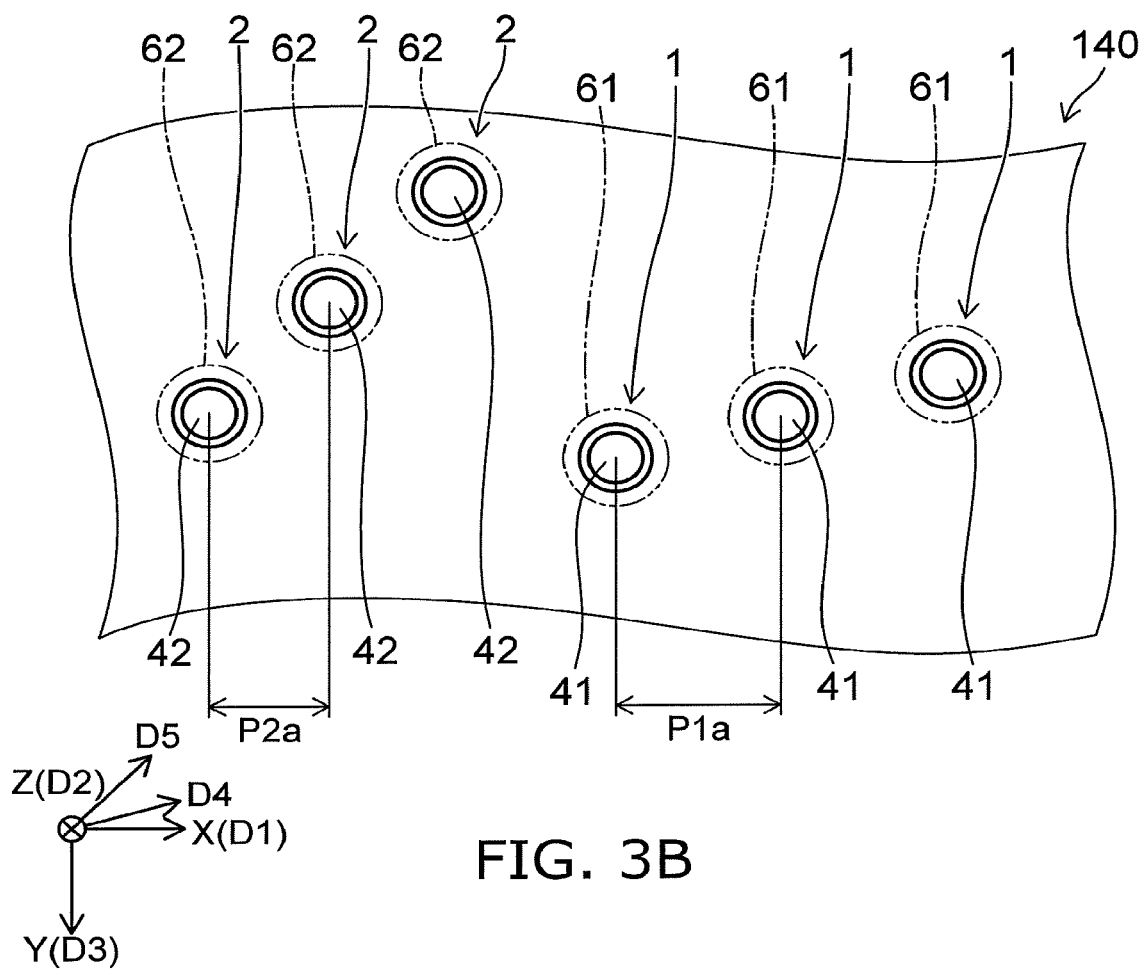

FIGS. 3A and 3B are schematic plan views illustrating alternative transducers according to the first embodiment.

In the transducer 130 shown in FIG. 3A, the plurality of second structure sections 2 are spaced from the plurality of first structure sections 1 further in the Y-direction.

In the transducer 140 shown in FIG. 3B, the plurality of first structure sections 1 are arranged along a fourth direction crossing the plane including the X-direction and the Z-direction. The plurality of second structure sections 2 are arranged along a fifth direction crossing the plane including the X-direction and the Z-direction. The fifth direction is e.g. different from the fourth direction. The fifth direction may be identical to the fourth direction. The fourth direction and the fifth direction lie along the plane including the X-direction and the Y-direction. The fourth direction and the fifth direction lie along e.g. the direction D4 and the direction D5 shown in FIG. 3B, respectively.

In the transducers 130 and 140, the pitch P2a along the X-direction of the plurality of second structure sections 2 is shorter than the pitch P1a along the X-direction of the plurality of first structure sections 1.

Figure 4:
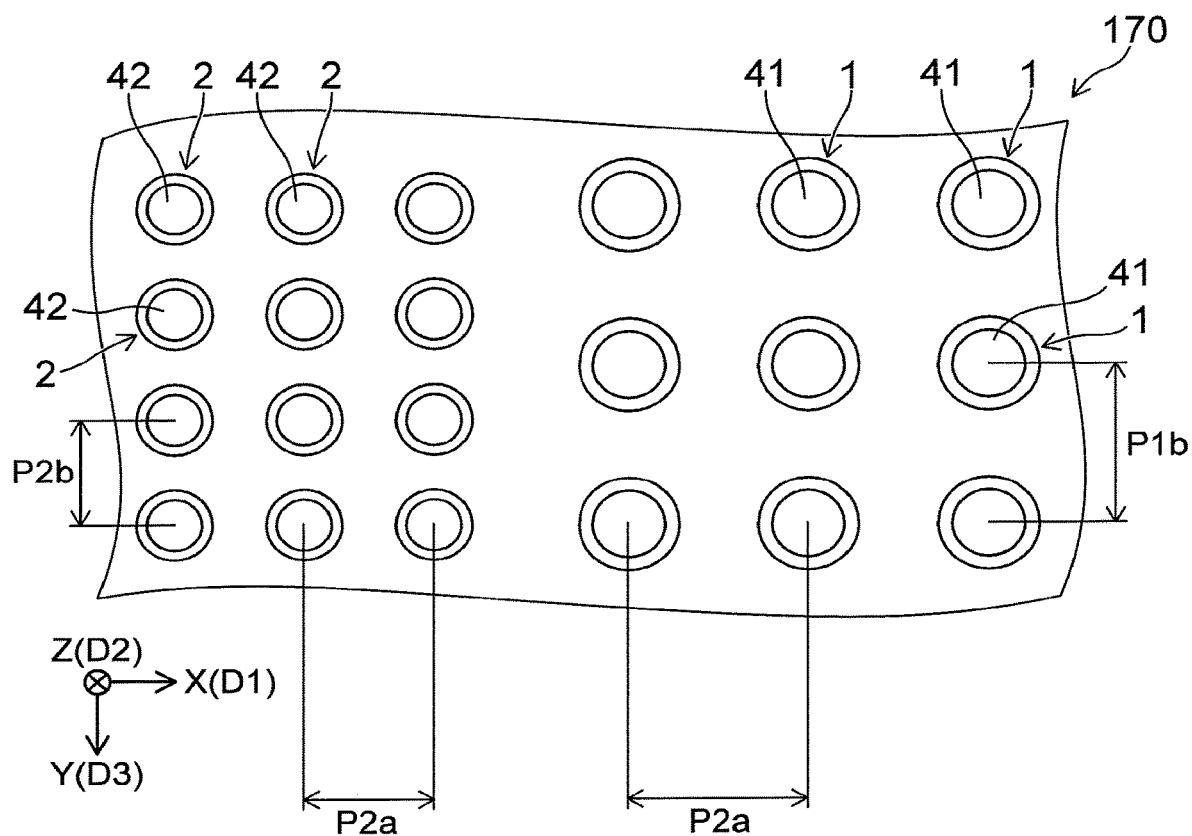
FIG. 4 is a schematic plan view illustrating an alternative transducer according to the first embodiment.

FIG. 4 is a schematic plan view illustrating an alternative transducer according to the first embodiment.

In the transducer 170 shown in FIG. 4, the plurality of first structure sections 1 and the plurality of second structure sections 2 are arranged along the X-direction and the Y-direction. The pitch P2b along the Y-direction of the plurality of second structure sections 2 is shorter than the pitch P1b along the Y-direction of the plurality of first structure sections 1.

The pitch P1b is equal to e.g. the distance along the Y-direction between the Y-direction center of one of the plurality of first electrodes 41 and the Y-direction center of a different one of the plurality of first electrodes 41. The different one of the plurality of first electrodes 41 is located next to the one of the plurality of first electrodes 41 in the Y-direction.

The pitch P2b is equal to e.g. the distance along the Y-direction between the Y-direction center of one of the plurality of second electrodes 42 and the Y-direction center of a different one of the plurality of second electrodes 42. The different one of the plurality of second electrodes 42 is located next to the one of the plurality of second electrodes 42 in the Y-direction.

Figure 5:
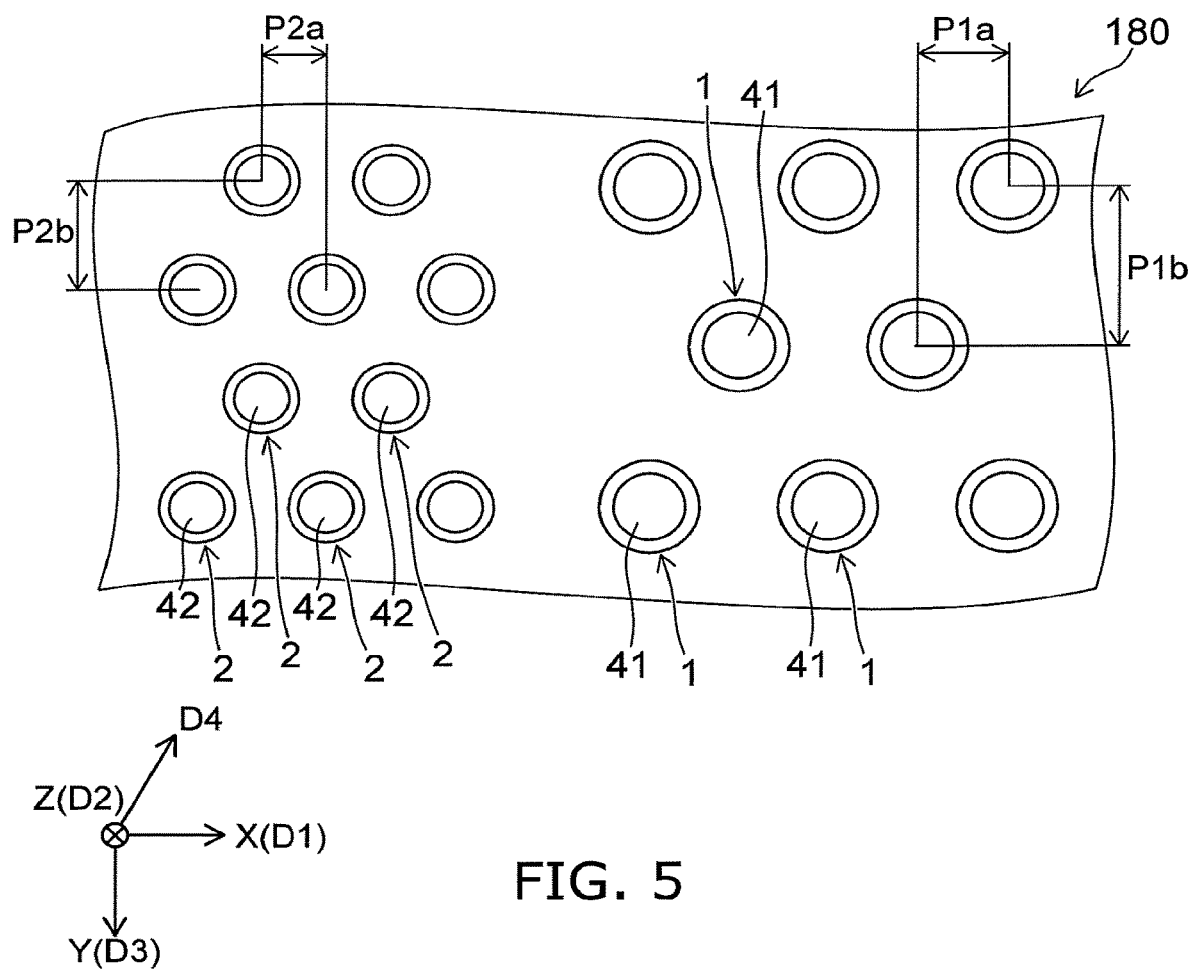
FIG. 5 is a schematic plan view illustrating an alternative transducer according to the first embodiment.

FIG. 5 is a schematic plan view illustrating an alternative transducer according to the first embodiment.

In the transducer 180 shown in FIG. 5, the plurality of first structure sections 1 and the plurality of second structure sections 2 are arranged along the X-direction and the fourth direction. The fourth direction crosses the X-direction and the Y-direction and lies along the plane including the X-direction and the Y-direction. The fourth direction lies along e.g. the direction D4 shown in FIG. 5.

The pitch P2a along the X-direction of the plurality of second structure sections 2 is shorter than the pitch P1a along the X-direction of the plurality of first structure sections 1. The pitch P2b along the Y-direction of the plurality of second structure sections 2 is shorter than the pitch P1b along the Y-direction of the plurality of first structure sections 1.

The pitch P1b is equal to e.g. the distance along the Y-direction between the Y-direction center of one of the plurality of first electrodes 41 and the Y-direction center of a different one of the plurality of first electrodes 41. The different one of the plurality of first electrodes 41 is located next to the one of the plurality of first electrodes 41 in the fourth direction.

The pitch P2b is equal to e.g. the distance along the Y-direction between the Y-direction center of one of the plurality of second electrodes 42 and the Y-direction center of a different one of the plurality of second electrodes 42. The different one of the plurality of second electrodes 42 is located next to the one of the plurality of second electrodes 42 in the fourth direction.

Figure 6:
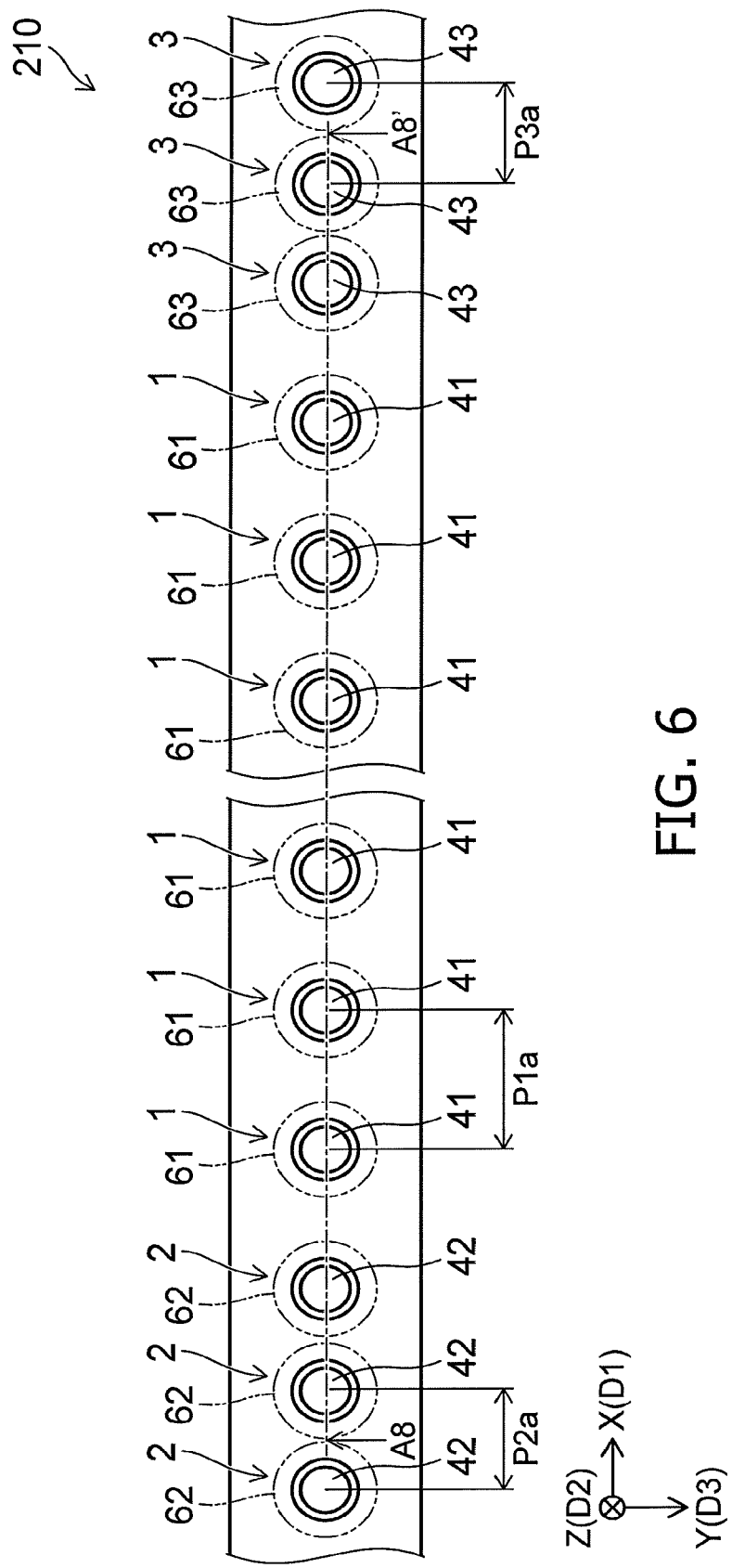
FIG. 6 is a schematic plan view illustrating a transducer according to a second embodiment.

FIG. 6 is a schematic plan view illustrating a transducer according to a second embodiment.

Figure 7:
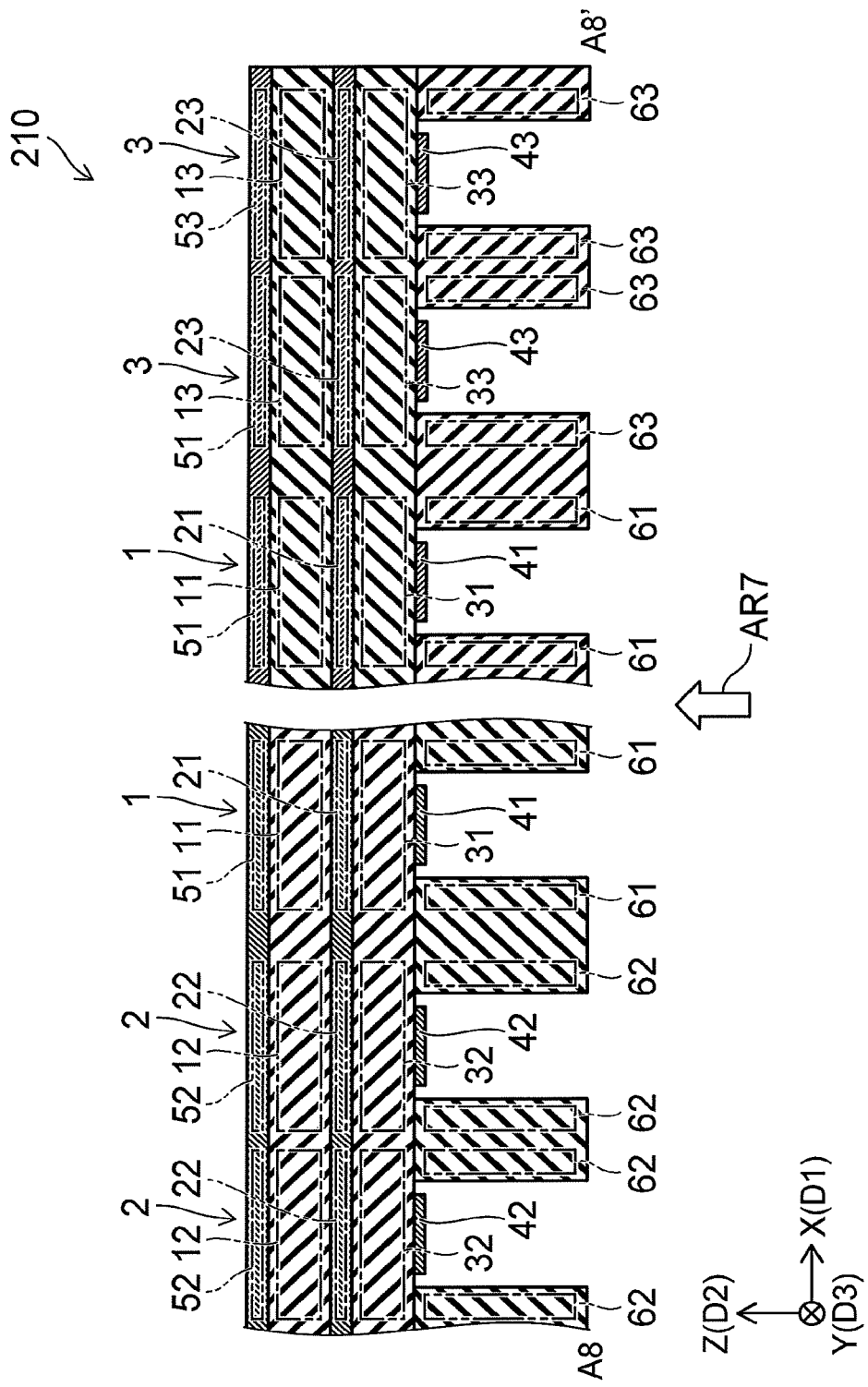
FIG. 7 is a schematic sectional view illustrating the transducer according to the second embodiment.

FIG. 7 is a schematic sectional view illustrating the transducer according to the second embodiment.

FIG. 6 is a plan view as viewed in the direction of arrow AR7 of FIG. 7. FIG. 7 is a sectional view taken along line A8-A8' of FIG. 6.

The transducer 210 shown in FIGS. 6 and 7 further includes a plurality of third structure sections 3. The plurality of third structure sections 3 are spaced from each other in the X-direction. The plurality of third structure sections 3 are spaced from the plurality of first structure sections 1 and the plurality of second structure sections 2 in the X-direction. The X-direction position of one of the plurality of first structure sections 1 is located between the X-direction position of one of the plurality of second structure sections 2 and the X-direction position of one of the plurality of third structure sections 3.

The direction from the plurality of first structure sections 1 to the plurality of third structure sections 3 lies along e.g. the X-direction.

The plurality of third structure sections 3 may be spaced from the plurality of first structure sections 1 further in the Y-direction.

Each of the plurality of third structure sections 3 includes a third membrane part 13, a third conductive part 23, a third piezoelectric part 33, and a third electrode 43. In the example shown in FIG. 7, each of the plurality of third structure sections 3 further includes a third opposite conductive part 53.

The third membrane part 13 is provided between the third conductive part 23 and the third opposite conductive part 53 in the Z-direction. The third conductive part 23 is provided between the third membrane part 13 and the third piezoelectric part 33 in the Z-direction. Part of the third piezoelectric part 33 is provided between part of the third conductive part 23 and the third electrode 43 in the Z-direction. The thickness of the third piezoelectric part 33 is e.g. equal to the thickness of the first piezoelectric part 31.

Part of each of the plurality of third structure sections 3 is fixed. For instance, as shown in FIGS. 6 and 7, the transducer 210 further includes a plurality of third support parts 63. The direction from the plurality of third support parts 63 to the plurality of third structure sections 3 lies along the Z-direction. Part of the third piezoelectric part 33 overlaps the third support part 63 in the Z-direction.

As shown in FIG. 6, the pitch P3a along the X-direction of the plurality of third structure sections 3 is shorter than the pitch P1a along the X-direction of the plurality of first structure sections 1. The pitch P3a is equal to e.g. the distance along the X-direction between the X-direction center of one of a plurality of third electrodes 43 and the X-direction center of a different one of the plurality of third electrodes 43. The different one of the plurality of third electrodes 43 is located next to the one of the plurality of third electrodes 43 in the X-direction.

This transducer 210 can improve e.g. the resolution in the plurality of third structure sections 3.

Figure 8A:
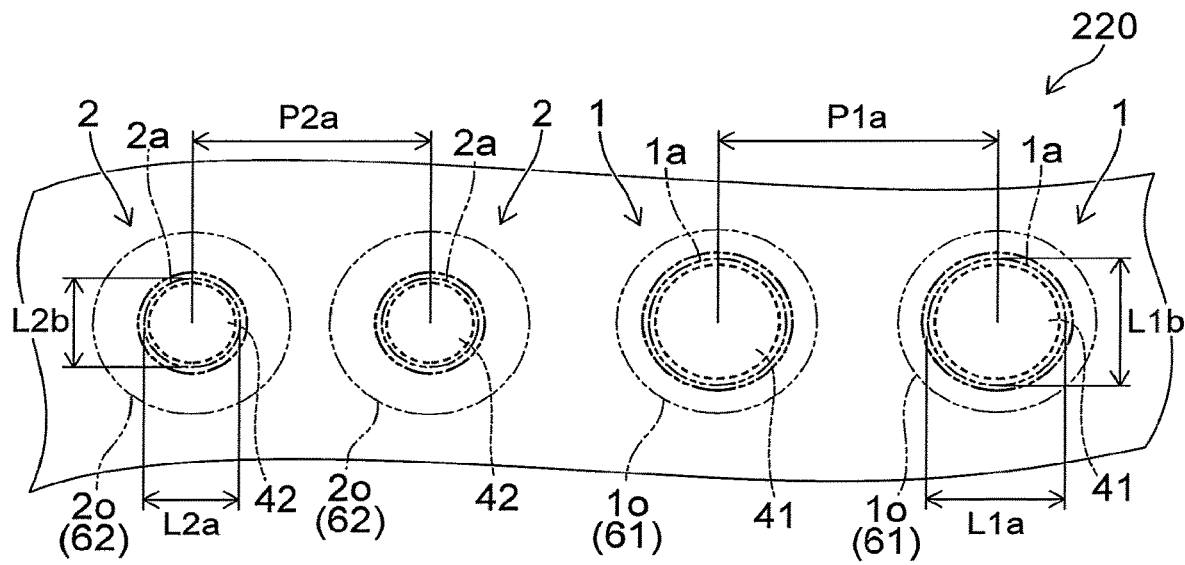
FIGS. 8A and 8B are schematic plan views illustrating an alternative transducer according to the second embodiment.
Figure 8B:
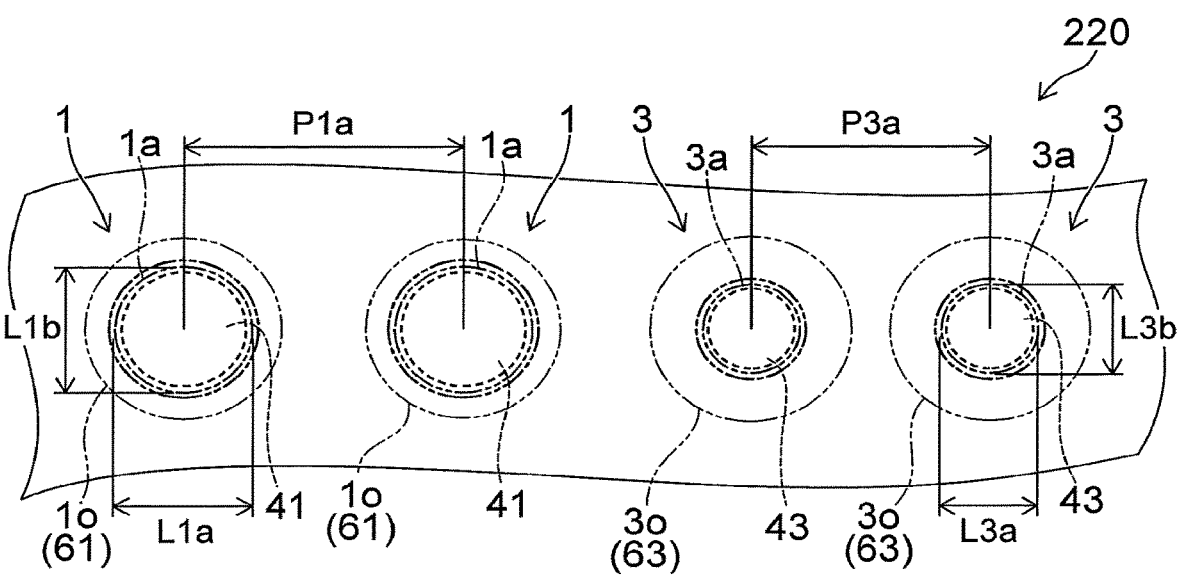

FIGS. 8A and 8B are schematic plan views illustrating an alternative transducer according to the second embodiment.

In the transducer 220 shown in FIGS. 8A and 8B, the third structure section 3 includes a third region 3a and a third overlapping region 3o. The third region 3a does not overlap the third support part 63 in the Z-direction. The third overlapping region 3o overlaps the third support part 63 in the Z-direction. The direction from the third region 3a to the third overlapping region 3o lies along a plane crossing the Z-direction.

As in the transducer 120 shown in FIGS. 2A and 2B, the first structure section 1 includes a first region 1a and a first overlapping region 1o. The second structure section 2 includes a second region 2a and a second overlapping region 2o.

The length L3a along the X-direction of the third region 3a is shorter than the length L1a along the X-direction of the first region 1a. The length L3b along the Y-direction of the third region 3a is shorter than the length L1b along the Y-direction of the first region 1a.

This transducer 220 can further improve the resolution in the plurality of third structure sections 3.

Figure 9:
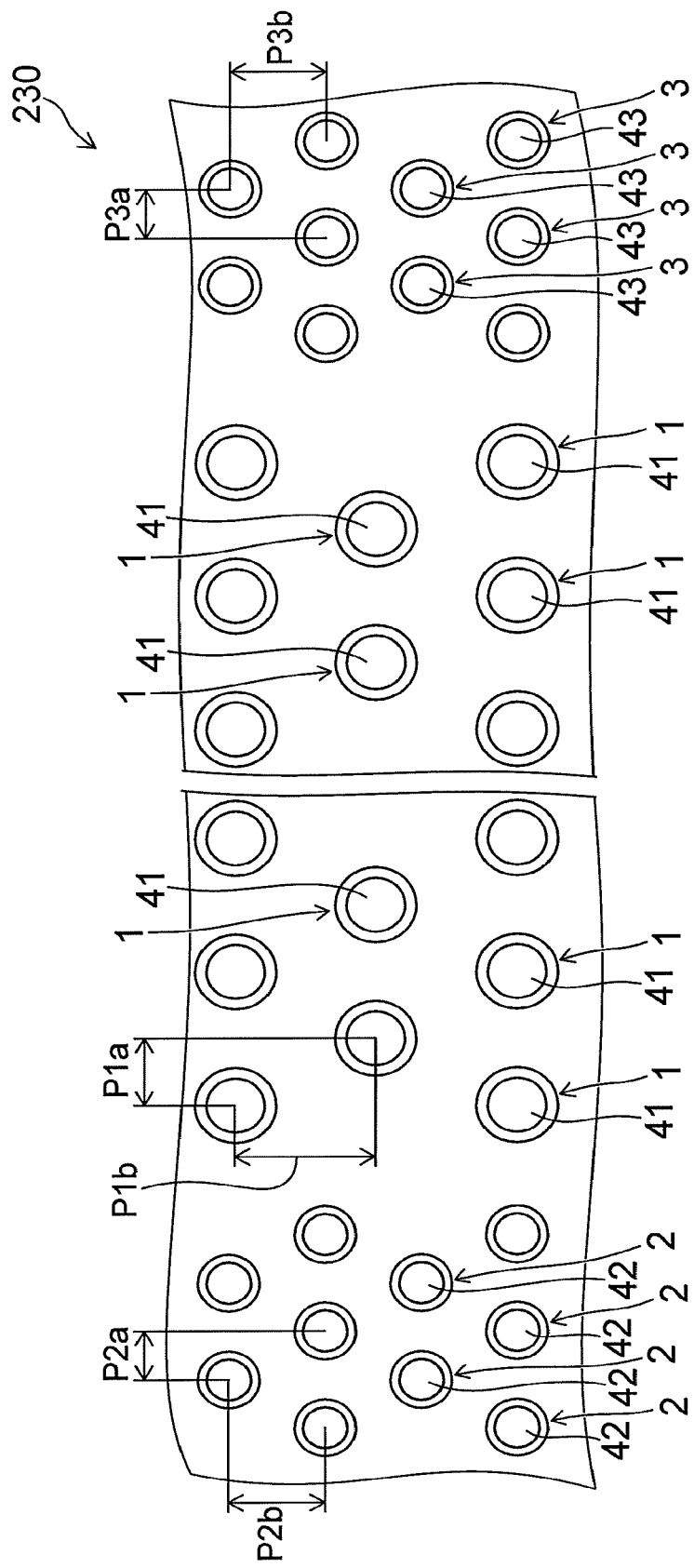
FIG. 9 is a schematic plan view illustrating an alternative transducer according to the second embodiment.
Figure 9:
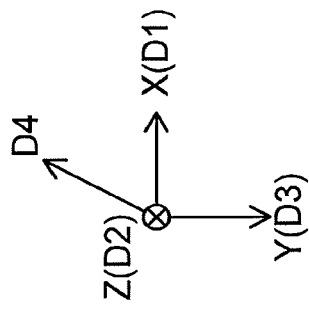

FIG. 9 is a schematic plan view illustrating an alternative transducer according to the second embodiment.

In the transducer 230 shown in FIG. 9, the plurality of first structure sections 1, the plurality of second structure sections 2, and the plurality of third structure sections 3 are arranged along the X-direction and a fourth direction. The fourth direction crosses the X-direction and the Y-direction and lies along the plane including the X-direction and the Y-direction. The fourth direction lies along e.g. the direction D4 shown in FIG. 5.

The pitch P3a along the X-direction of the plurality of third structure sections 3 is shorter than the pitch P1a along the X-direction of the plurality of first structure sections 1. The pitch P3b along the Y-direction of the plurality of third structure sections 3 is shorter than the pitch P1b along the Y-direction of the plurality of first structure sections 1.

The pitch P3b is equal to e.g. the Y-direction distance between the Y-direction center of one of the plurality of third electrodes 43 and the Y-direction center of a different one of the plurality of third electrodes 43. The different one of the plurality of third electrodes 43 is located next to the one of the plurality of third electrodes 43 in the fourth direction.

In the transducer 230, the plurality of third structure sections 3 may be arranged along the X-direction and the Y-direction like the plurality of second structure sections 2 in the transducer 170 shown in FIG. 4. In this case, the pitch along the Y-direction of the plurality of third structure sections 3 is shorter than the pitch along the Y-direction of the plurality of first structure sections 1.

Figure 10:
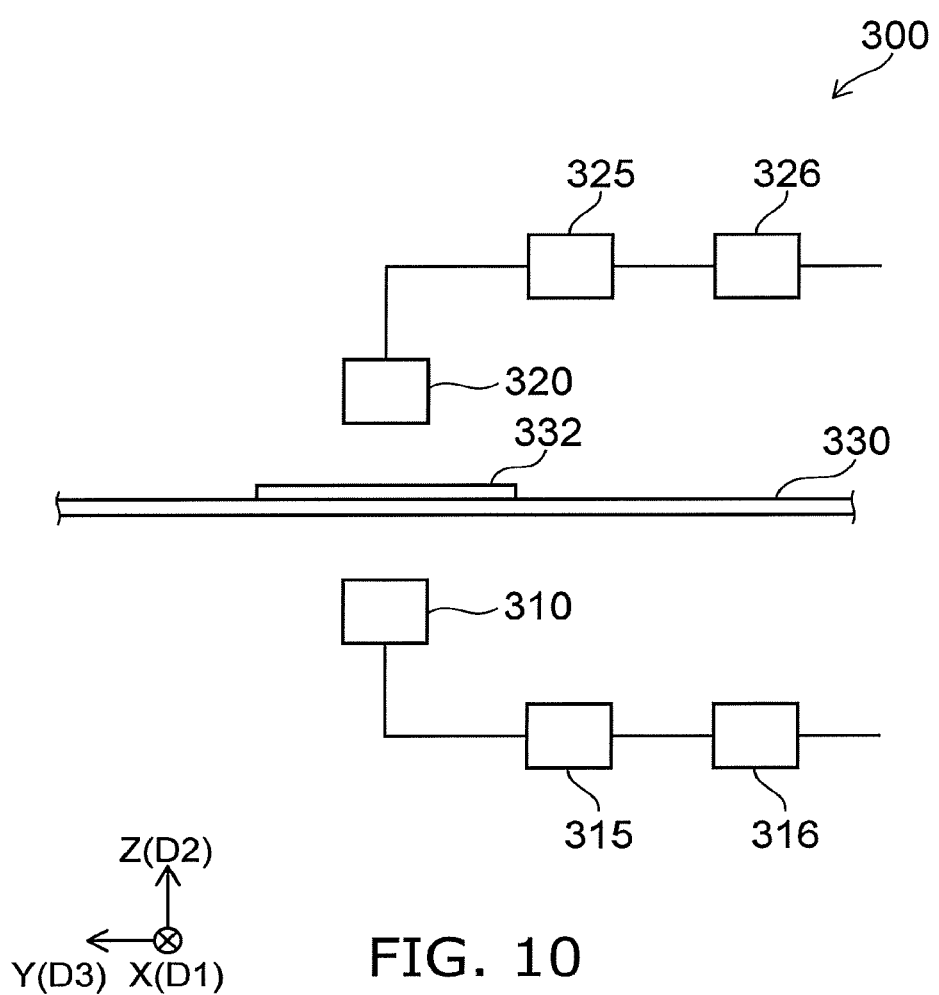
FIG. 10 is a schematic view illustrating an inspection device according to a third embodiment.

FIG. 10 is a schematic view illustrating an inspection device according to a third embodiment.

Figure 11:
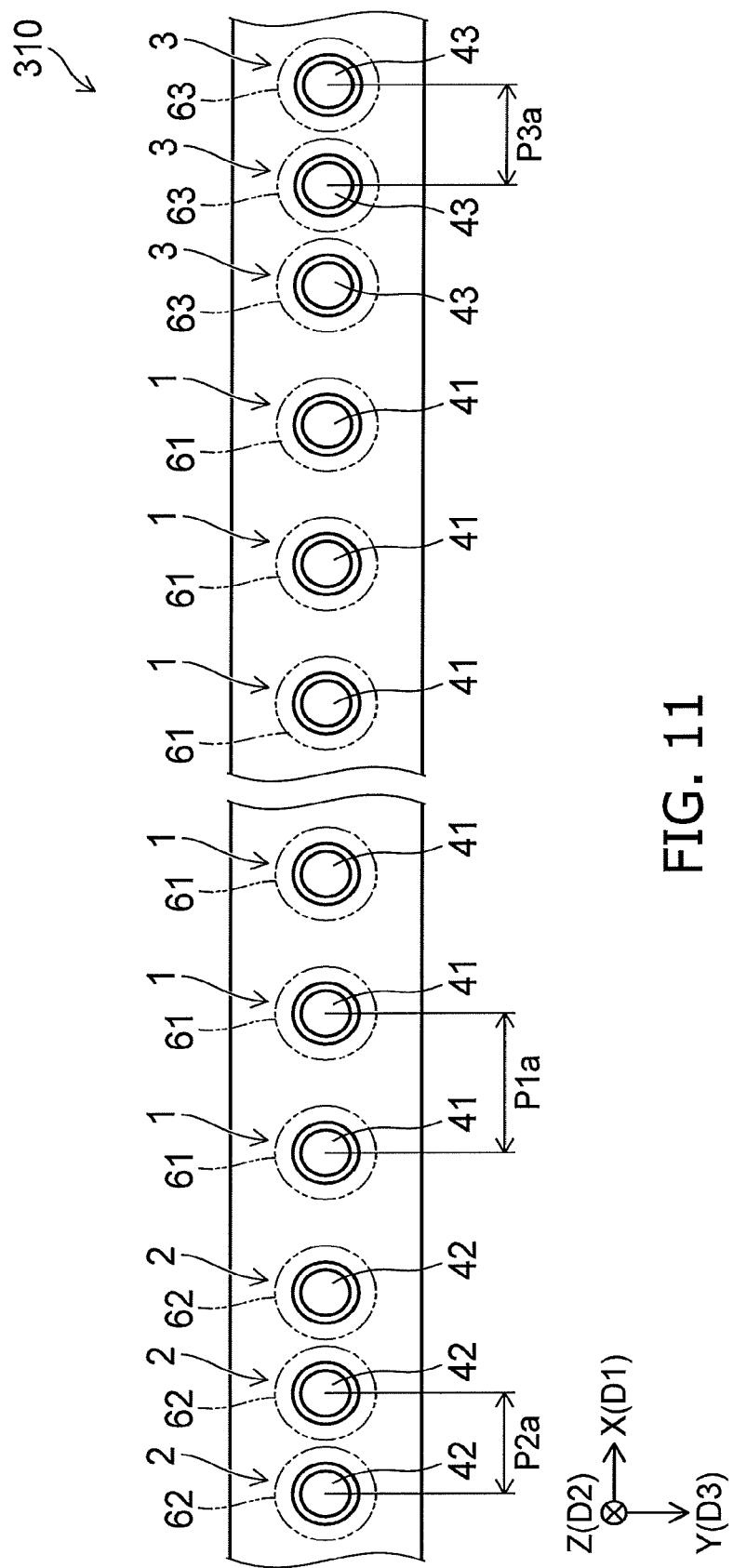
FIG. 11 is a schematic plan view illustrating the inspection device according to the third embodiment.

FIG. 11 is a schematic plan view illustrating the inspection device according to the third embodiment.

Figure 12:
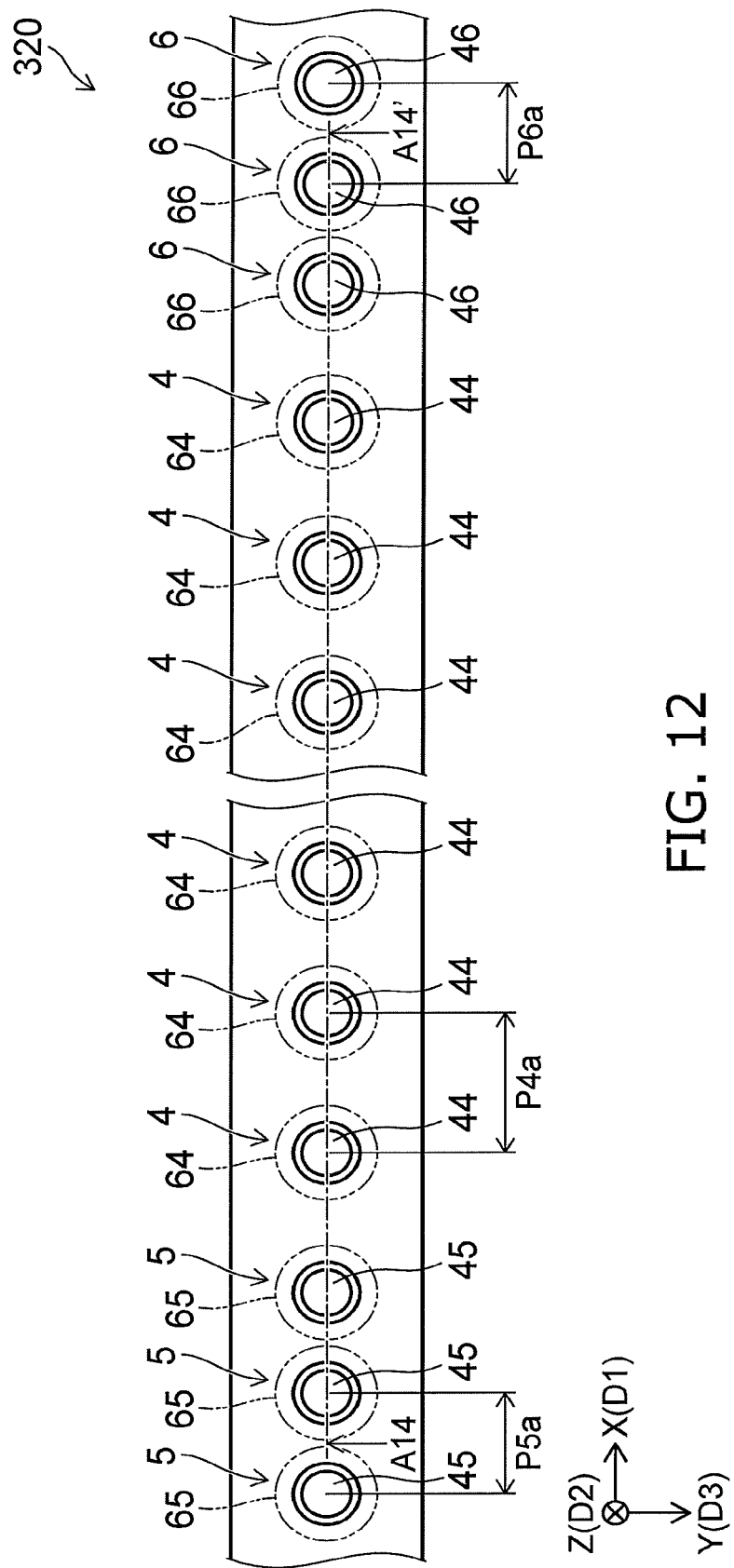
FIG. 12 is a schematic plan view illustrating the inspection device according to the third embodiment.

FIG. 12 is a schematic plan view illustrating the inspection device according to the third embodiment. FIG. 12 is a plan view as viewed in the direction of arrow AR13 of FIG. 13.

Figure 13:
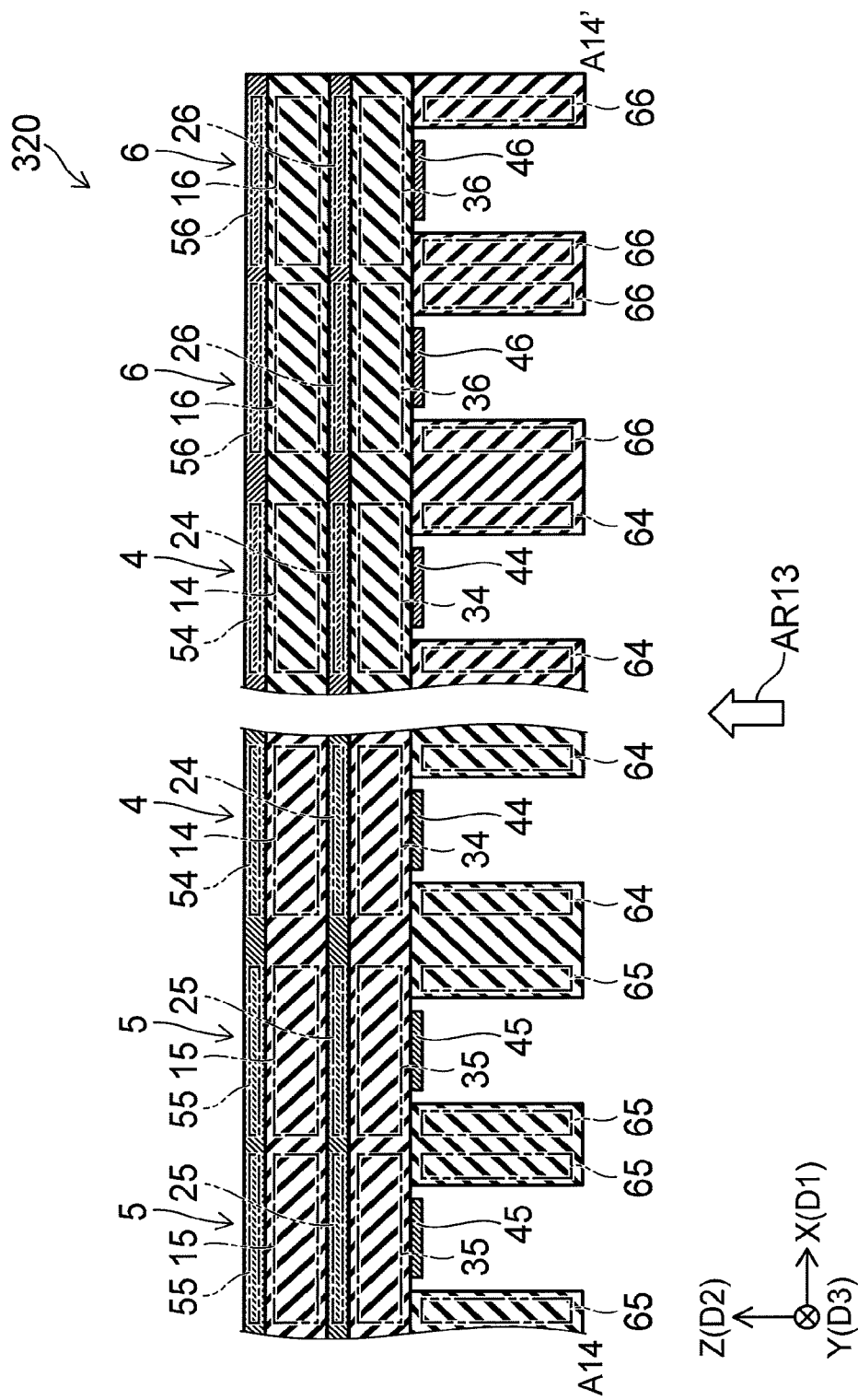
FIG. 13 is a schematic sectional view illustrating the inspection device according to the third embodiment.

FIG. 13 is a schematic sectional view illustrating the inspection device according to the third embodiment. FIG. 13 is a sectional view taken along line A14-A14' of FIG. 12.

The inspection device 300 shown in FIG. 10 includes a first transducer 310, a second transducer 320, and a transport section 330. The second transducer 320 is spaced from the first transducer 310 in the Z-direction. Part of the transport section 330 is provided between the first transducer 310 and the second transducer 320 in the Z-direction. The direction from the first transducer 310 to the second transducer 320 may cross the X-direction and the Z-direction and lie along the plane including the X-direction and the Z-direction.

As shown in FIG. 11, the first transducer 310 includes a plurality of first structure sections 1 and a plurality of second structure sections 2. The structure of the plurality of first structure sections 1 and the plurality of second structure sections 2 in the first transducer 310 is similar to e.g. the structure of the plurality of first structure sections 1 and the plurality of second structure sections 2 in any one of the transducers according to the first embodiment.

In the example shown in FIG. 11, the first transducer 310 further includes a plurality of third structure sections 3. The structure of the plurality of first structure sections 1, the plurality of second structure sections 2, and the plurality of third structure sections 3 in the first transducer 310 is similar to e.g. the structure of the plurality of first structure sections 1, the plurality of second structure sections 2, and the plurality of third structure sections 3 in any one of the transducers according to the second embodiment.

As shown in FIG. 12, the second transducer 320 includes e.g. a plurality of fourth structure sections 4 and a plurality of fifth structure sections 5. The plurality of fourth structure sections 4 are spaced from each other in the X-direction. The plurality of fifth structure sections 5 are spaced from each other in the X-direction. The plurality of fifth structure sections 5 are spaced from the plurality of fourth structure sections 4 in the X-direction.

The plurality of fourth structure sections 4 and the plurality of fifth structure sections 5 are arranged along e.g. the X-direction. The plurality of fourth structure sections 4 and the plurality of fifth structure sections 5 may be arranged along a direction crossing the X-direction and the Y-direction and crossing the plane including the X-direction and the Y-direction.

The direction from the plurality of fifth structure sections 5 to the plurality of fourth structure sections 4 lies along e.g. the X-direction. The plurality of fifth structure sections 5 may be spaced from the plurality of fourth structure sections 4 further in the Y-direction.

As shown in FIG. 13, each of the plurality of fourth structure sections 4 includes a fourth membrane part 14, a fourth conductive part 24, a fourth piezoelectric part 34, and a fourth electrode 44. In the example shown in FIG. 13, each of the plurality of fourth structure sections 4 further includes a fourth opposite conductive part 54.

The fourth membrane part 14 is provided between the fourth conductive part 24 and the fourth opposite conductive part 54 in the Z-direction. The fourth conductive part 24 is provided between the fourth membrane part 14 and the fourth piezoelectric part 34 in the Z-direction. Part of the fourth piezoelectric part 34 is provided between part of the fourth conductive part 24 and the fourth electrode 44 in the Z-direction.

Each of the plurality of fifth structure sections 5 includes a fifth membrane part 15, a fifth conductive part 25, a fifth piezoelectric part 35, and a fifth electrode 45. In the example shown in FIG. 13, each of the plurality of fifth structure sections 5 further includes a fifth opposite conductive part 55.

The fifth membrane part 15 is provided between the fifth conductive part 25 and the fifth opposite conductive part 55 in the Z-direction. The fifth conductive part 25 is provided between the fifth membrane part 15 and the fifth piezoelectric part 35 in the Z-direction. Part of the fifth piezoelectric part 35 is provided between part of the fifth conductive part 25 and the fifth electrode 45 in the Z-direction. The thickness of the fifth piezoelectric part 35 is e.g. equal to the thickness of the fourth piezoelectric part 34.

Part of each of the plurality of fourth structure sections 4 and part of each of the plurality of fifth structure sections 5 are fixed. For instance, the second transducer 320 further includes a plurality of fourth support parts 64 and a plurality of fifth support parts 65. The direction from the plurality of fourth support parts 64 to the plurality of fourth structure sections 4 lies along the Z-direction. The direction from the plurality of fifth support parts 65 to the plurality of fifth structure sections 5 lies along the Z-direction. Part of the fourth structure section 4 overlaps the fourth support part 64 in the Z-direction. Part of the fifth structure section 5 overlaps the fifth support part 65 in the Z-direction.

As shown in FIG. 12, the pitch P5a along the X-direction of the plurality of fifth structure sections 5 is shorter than the pitch P4a along the X-direction of the plurality of fourth structure sections 4.

The pitch P4a is equal to e.g. the distance along the X-direction between the X-direction center of one of a plurality of fourth electrodes 44 and the X-direction center of a different one of the plurality of fourth electrodes 44. The different one of the plurality of fourth electrodes 44 is located next to the one of the plurality of fourth electrodes 44 in the X-direction.

The pitch P5a is equal to e.g. the X-direction distance between the X-direction center of one of a plurality of fifth electrodes 45 and the X-direction center of a different one of the plurality of fifth electrodes 45. The different one of the plurality of fifth electrodes 45 is located next to the one of the plurality of fifth electrodes 45 in the X-direction.

In the example shown in FIGS. 12 and 13, the second transducer 320 further includes a plurality of sixth structure sections 6. The plurality of sixth structure sections 6 are spaced from each other in the X-direction. The plurality of sixth structure sections 6 are spaced from the plurality of fourth structure sections 4 and the plurality of fifth structure sections 5 in the X-direction. The X-direction position of one of the plurality of fourth structure sections 4 is located between the X-direction position of one of the plurality of fifth structure sections 5 and the X-direction position of one of the plurality of sixth structure sections 6.

The direction from the plurality of fourth structure sections 4 to the plurality of sixth structure sections 6 lies along e.g. the X-direction.

The plurality of sixth structure sections 6 may be spaced from the plurality of fourth structure sections 4 further in the Y-direction. The plurality of sixth structure sections 6 are arranged along e.g. the X-direction. The plurality of sixth structure sections 6 may be arranged along a direction crossing the plane including the X-direction and the Z-direction.

Each of the plurality of sixth structure sections 6 includes a sixth membrane part 16, a sixth conductive part 26, a sixth piezoelectric part 36, and a sixth electrode 46. In the example shown in FIG. 13, each of the plurality of sixth structure sections 6 further includes a sixth opposite conductive part 56.

The sixth membrane part 16 is provided between the sixth conductive part 26 and the sixth opposite conductive part 56 in the Z-direction. The sixth conductive part 26 is provided between the sixth membrane part 16 and the sixth piezoelectric part 36 in the Z-direction. Part of the sixth piezoelectric part 36 is provided between part of the sixth conductive part 26 and the sixth electrode 46 in the Z-direction. The thickness of the sixth piezoelectric part 36 is e.g. equal to the thickness of the fourth piezoelectric part 34.

Part of each of the plurality of sixth structure sections 6 is fixed. For instance, the second transducer 320 further includes a plurality of sixth support parts 66. The direction from the plurality of sixth support parts 66 to the plurality of sixth structure sections 6 lies along the Z-direction. Part of the sixth piezoelectric part 36 overlaps the sixth support part 66 in the Z-direction.

As shown in FIG. 12, the pitch P6a along the X-direction of the plurality of sixth structure sections 6 is shorter than the pitch P1a along the X-direction of the plurality of first structure sections 1. The pitch P6a is equal to e.g. the distance along the X-direction between the X-direction center of one of a plurality of sixth electrodes 46 and the X-direction center of a different one of the plurality of sixth electrodes 46. The different one of the plurality of sixth electrodes 46 is located next to the one of the plurality of sixth electrodes 46 in the X-direction.

The first transducer 310 functions as e.g. a transmitter for emitting an ultrasonic wave. The second transducer 320 functions as e.g. a receiver for receiving an ultrasonic wave. The transport section 330 transports a piece of paper (e.g. a bank bill) 322. The transporting direction of the paper 322 preferably crosses the arranging direction of the plurality of first structure sections 1, the plurality of second structure sections 2, and the plurality of third structure sections 3. The transporting direction of the paper 322 preferably crosses the arranging direction of the plurality of fourth structure sections 4, the plurality of fifth structure sections 5, and the plurality of sixth structure sections 6. The transport section 330 transports the paper 332 along e.g. the Y-direction.

The inspection device 300 further includes e.g. a control circuit 315, a control section 316, an amplifier 325, and a detector 326. The control circuit 315 is electrically connected between the first transducer 310 and the control section 316.

The control section 316 sends a control signal to the control circuit 315. Based on this control signal, the control circuit 315 generates a driving signal (e.g. sinusoidal signal). The first transducer 310 is driven by this driving signal and emits an ultrasonic wave.

The second transducer 320 receives an ultrasonic wave. The second transducer 320 converts oscillation to a signal and outputs it to the amplifier 325. The amplifier 325 amplifies the inputted signal. The amplified signal is outputted to the detector 326. The detector 326 detects e.g. the voltage value of the inputted signal.

The detector 326 compares e.g. the detected voltage value with a prescribed threshold. When the voltage value is lower than the threshold, the comparison result is notified to the outside. For instance, when the paper is affixed with e.g. a strip of tape, the ultrasonic wave transmitted through the paper is attenuated by the tape. This decreases the voltage value detected by the detector 326. Thus, the inspection device 300 can detect attachment of foreign matter to the paper.

The first transducer 310 includes a plurality of first structure sections 1 and a plurality of second structure sections 2. The pitch along the X-direction of the plurality of second structure sections 2 is shorter than the pitch along the X-direction of the plurality of first structure sections 1. This decreases the power of the ultrasonic wave emitted from the plurality of second structure sections 2. For instance, the power of the ultrasonic wave emitted toward the edge of the paper can be decreased. This can reduce the power of the ultrasonic wave reaching the second transducer 320 around the edge of the paper.

The second transducer 320 includes a plurality of fourth structure sections 4 and a plurality of fifth structure sections 5. The pitch along the X-direction of the plurality of fifth structure sections 5 is shorter than the pitch along the X-direction of the plurality of fourth structure sections 4. This improves the resolution in the plurality of fifth structure sections 5. For instance, the acoustic wave transmitted through the edge of the paper can be detected with high resolution. Thus, foreign matter attached to the edge of the paper can be inspected with higher accuracy.

Figure 14A:
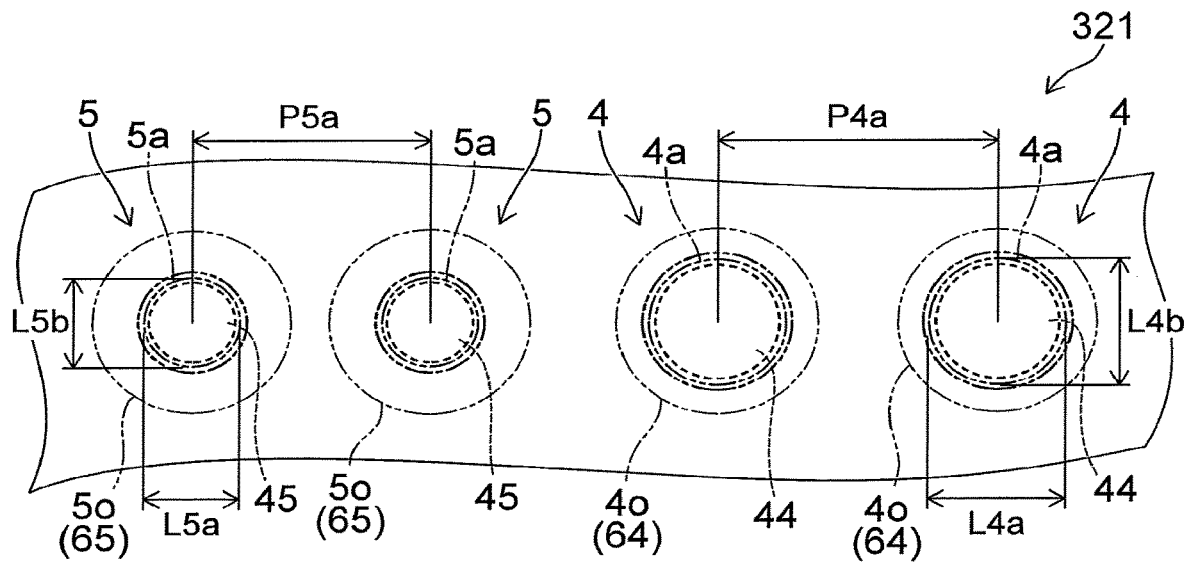
FIGS. 14A and 14B are schematic plan views illustrating an alternative inspection device according to the third embodiment.
Figure 14B:
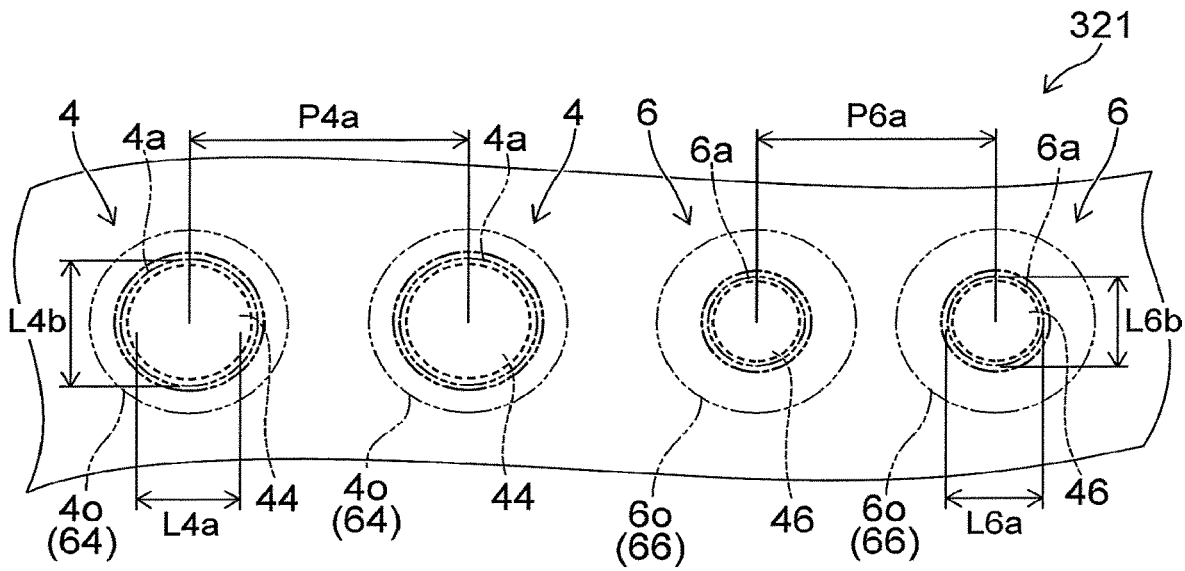

FIGS. 14A and 14B are schematic plan views illustrating an alternative inspection device according to the third embodiment.

The inspection device 300 may include a second transducer 321 instead of the second transducer 320. In the second transducer 321 shown in FIGS. 14A and 14B, the fourth structure section 4 includes a fourth region 4a and a fourth overlapping region 4o. The fourth region 4a does not overlap the fourth support part 64 in the Z-direction. The fourth overlapping region 4o overlaps the fourth support part 64 in the Z-direction. The direction from the fourth region 4a to the fourth overlapping region 4o lies along a plane crossing the Z-direction.

The fifth structure section 5 includes a fifth region 5a and a fifth overlapping region 5o. The fifth region 5a does not overlap the fifth support part 65 in the Z-direction. The fifth overlapping region 5o overlaps the fifth support part 65 in the Z-direction. The direction from the fifth region 5a to the fifth overlapping region 5o lies along a plane crossing the Z-direction.

The sixth structure section 6 includes a sixth region 6a and a sixth overlapping region 6o. The sixth region 6a does not overlap the sixth support part 66 in the Z-direction. The sixth overlapping region 6o overlaps the sixth support part 66 in the Z-direction. The direction from the sixth region 6a to the sixth overlapping region 6o lies along a plane crossing the Z-direction.

As shown in FIG. 14A, the length L5a along the X-direction of the fifth region 5a is shorter than the length L4a along the X-direction of the fourth region 4a. The length L5b along the Y-direction of the fifth region 5a is shorter than the length L4b along the Y-direction of the fourth region 4a. The pitch P5a along the X-direction of the plurality of fifth structure sections 5 is e.g. shorter than the pitch P4a along the X-direction of the plurality of fourth structure sections 4.

As shown in FIG. 14B, the length L6a along the X-direction of the sixth region 6a is shorter than the length L4a. The length L6b along the Y-direction of the sixth region 6a is shorter than the length L4b. The pitch P6a along the X-direction of the plurality of sixth structure sections 6 is e.g. shorter than the pitch P4a.

Figure 15:
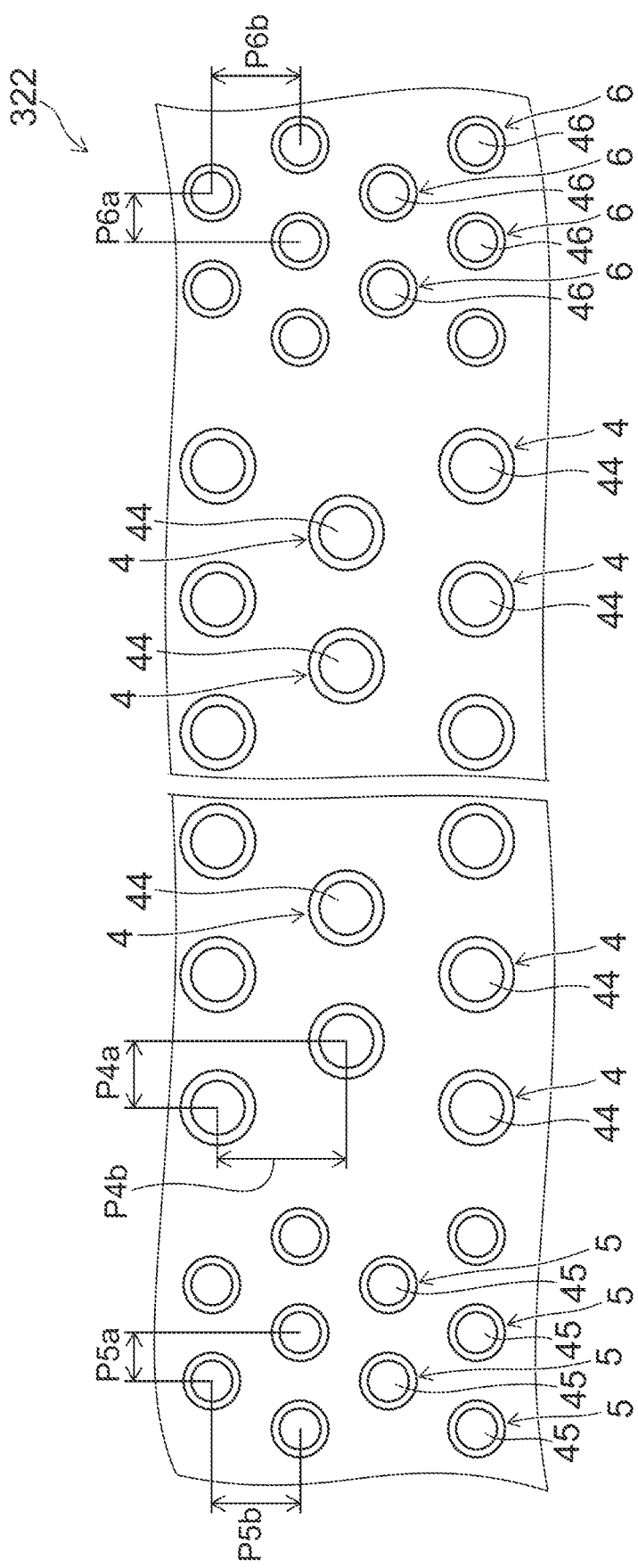
FIG. 15 is a schematic plan view illustrating an alternative inspection device according to the third embodiment.

FIG. 15 is a schematic plan view illustrating an alternative inspection device according to the third embodiment.

The inspection device 300 may include a second transducer 322 instead of the second transducer 320. In the second transducer 322 shown in FIG. 15, the plurality of fourth structure sections 4, the plurality of fifth structure sections 5, and the plurality of sixth structure sections 6 are arranged along the X-direction and a fourth direction. The fourth direction crosses the X-direction and the Y-direction and lies along the plane including the X-direction and the Y-direction. The fourth direction lies along e.g. the direction D4 shown in FIG. 15.

The pitch P5a along the X-direction of the plurality of fifth structure sections 5 is shorter than the pitch P4a along the X-direction of the plurality of fourth structure sections 4. The pitch P5b along the Y-direction of the plurality of fifth structure sections 5 is shorter than the pitch P4b along the Y-direction of the plurality of fourth structure sections 4. The pitch P6a along the X-direction of the plurality of sixth structure sections 6 is shorter than the pitch P4a. The pitch P6b along the Y-direction of the plurality of sixth structure sections 6 is shorter than the pitch P4b.

The pitch P4b is equal to e.g. the distance along the Y-direction between the Y-direction center of one of the plurality of fourth electrodes 44 and the Y-direction center of a different one of the plurality of fourth electrodes 44. The different one of the plurality of fourth electrodes 44 is located next to the one of the plurality of fourth electrodes 44 in the fourth direction.

The pitch P5b is equal to e.g. the distance along the Y-direction between the Y-direction center of one of the plurality of fifth electrodes 45 and the Y-direction center of a different one of the plurality of fifth electrodes 45. The different one of the plurality of fifth electrodes 45 is located next to the one of the plurality of fifth electrodes 45 in the fourth direction.

The pitch P6b is equal to e.g. the distance along the Y-direction between the Y-direction center of one of the plurality of sixth electrodes 46 and the Y-direction center of a different one of the plurality of sixth electrodes 46. The different one of the plurality of sixth electrodes 46 is located next to the one of the plurality of sixth electrodes 46 in the fourth direction.

An example of the material of each component is now described.

The first membrane part 11, the second membrane part 12, the third membrane part 13, the fourth membrane part 14, the fifth membrane part 15, and the sixth membrane part 16 contain e.g. insulating ceramic. The insulating ceramic is e.g. alumina. The material contained in the first membrane part 11, the second membrane part 12, the third membrane part 13, the fourth membrane part 14, the fifth membrane part 15, and the sixth membrane part 16 may be the same as the material contained in at least one of the first piezoelectric part 31, the second piezoelectric part 32, the third piezoelectric part 33, the fourth piezoelectric part 34, the fifth piezoelectric part 35, and the sixth piezoelectric part 36.

The first conductive part 21, the second conductive part 22, the third conductive part 23, the fourth conductive part 24, the fifth conductive part 25, and the sixth conductive part 26 contain metal. The first conductive part 21, the second conductive part 22, the third conductive part 23, the fourth conductive part 24, the fifth conductive part 25, and the sixth conductive part 26 contain e.g. at least one selected from the group consisting of Au, Ag, and Cu.

The first piezoelectric part 31, the second piezoelectric part 32, the third piezoelectric part 33, the fourth piezoelectric part 34, the fifth piezoelectric part 35, and the sixth piezoelectric part 36 contain e.g. at least one selected from the group consisting of PZT ceramic and piezoelectric single crystal. These piezoelectric parts preferably contain a piezoelectric material generating flexural oscillation upon application of voltage.

The first electrode 41, the second electrode 42, the third electrode 43, the fourth electrode 44, the fifth electrode 45, and the sixth electrode 46 contain metal. The first electrode 41, the second electrode 42, the third electrode 43, the fourth electrode 44, the fifth electrode 45, and the sixth electrode 46 contain e.g. at least one selected from the group consisting of Au, Ag, and Cu.

The first opposite conductive part 51, the second opposite conductive part 52, the third opposite conductive part 53, the fourth opposite conductive part 54, the fifth opposite conductive part 55, and the sixth opposite conductive part 56 contain metal. The first opposite conductive part 51, the second opposite conductive part 52, the third opposite conductive part 53, the fourth opposite conductive part 54, the fifth opposite conductive part 55, and the sixth opposite conductive part 56 contain e.g. at least one selected from the group consisting of Au, Ag, and Cu.

The first support part 61, the second support part 62, the third support part 63, the fourth support part 64, the fifth support part 65, and the sixth support part 66 contain e.g. metal, resin, or ceramic. The metal is e.g. at least one selected from the group consisting of stainless steel and aluminum. The resin is e.g. acrylic resin. The ceramic is e.g. Macor.

The transport section 330 includes e.g. at least one of a roller and a belt for transporting the paper 332.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the first structure section, the second structure section, the third structure section, the fourth structure section, the fifth structure section, the sixth structure section, the first support part, the second support part, the third support part, the fourth support part, the fifth support part, the sixth support part, and the transport section, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all transducers and inspection devices practicable by an appropriate design modification by one skilled in the art based on the transducers and inspection devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A transducer comprising:
    a plurality of first structure sections spaced from each other in a first direction, part of each of the plurality of first structure sections being fixed, the each of the plurality of first structure sections including:
        a first membrane part;
        a first piezoelectric part;
        a first conductive part provided between at least part of the first membrane part and the first piezoelectric part in a second direction crossing the first direction; and
        a first electrode, at least part of the first piezoelectric part being located between at least part of the first conductive part and the first electrode in the second direction; and
    a plurality of second structure sections spaced from each other in the first direction, part of each of the plurality of second structure sections being fixed, each of the plurality of second structure sections including:
        a second membrane part;
        a second piezoelectric part;
        a second conductive part provided between at least part of the second membrane part and the second piezoelectric part in the second direction; and
        a second electrode, at least part of the second piezoelectric part being located between at least part of the second conductive part and the second electrode in the second direction,
    the plurality of second structure sections being spaced from the plurality of first structure sections in the first direction, and pitch along the first direction of the plurality of second structure sections being shorter than pitch along the first direction of the plurality of first structure sections.

2. The transducer according to claim 1, further comprising:
    a plurality of first support parts; and
    a plurality of second support parts,
    wherein direction from the plurality of first support parts to the plurality of first structure sections lies along the second direction,
    direction from the plurality of second support parts to the plurality of second structure sections lies along the second direction,
    one of the plurality of first structure sections includes:
        a first region not overlapping one of the plurality of first support parts in the second direction; and
        a first overlapping region overlapping the one of the plurality of first support parts in the second direction,
    one of the plurality of second structure sections includes:
        a second region not overlapping one of the plurality of second support parts in the second direction; and
        a second overlapping region overlapping the one of the plurality of second support parts in the second direction, and
    length along the first direction of the second region is shorter than length along the first direction of the first region.

3. The transducer according to claim 1, further comprising:
    a plurality of first support parts; and
    a plurality of second support parts,
    wherein direction from the plurality of first support parts to the plurality of first structure sections lies along the second direction,
    direction from the plurality of second support parts to the plurality of second structure sections lies along the second direction,
    one of the plurality of first structure sections includes:
        a first region not overlapping one of the plurality of first support parts in the second direction; and
        a first overlapping region overlapping the one of the plurality of first support parts in the second direction,
    one of the plurality of second structure sections includes:
        a second region not overlapping one of the plurality of second support parts in the second direction; and
        a second overlapping region overlapping the one of the plurality of second support parts in the second direction, and
    length of the second region along a third direction crossing a plane including the first direction and the second direction is shorter than length of the first region along the third direction.

4. The transducer according to claim 1, wherein
    the plurality of first structure sections are arranged in the first direction, and the plurality of second structure sections are arranged in the first direction.

5. The transducer according to claim 1, wherein the plurality of first structure sections are arranged in a fourth direction crossing a plane including the first direction and the second direction.

6. The transducer according to claim 1, wherein the plurality of second structure sections are arranged in a fifth direction crossing a plane including the first direction and the second direction.

7. The transducer according to claim 1, wherein direction from the plurality of second structure sections to the plurality of first structure sections lies along the first direction.

8. The transducer according to claim 1, wherein the plurality of second structure sections are spaced from the plurality of first structure sections in a direction crossing a plane including the first direction and the second direction.

9. The transducer according to claim 1, wherein
each of the plurality of first structure sections further includes a first opposite conductive part,
at least part of the first membrane part is provided between at least part of the first opposite conductive part and the first conductive part,
each of the plurality of second structure sections further includes a second opposite conductive part, and
at least part of the second membrane part is provided between at least part of the second opposite conductive part and the second conductive part.

10. The transducer according to claim 1, further comprising:
a plurality of third structure sections,
wherein each of the plurality of third structure sections includes:
a third membrane part;
a third piezoelectric part;
a third conductive part provided between at least part of the third membrane part and the third piezoelectric part in the second direction; and
a third electrode, at least part of the third piezoelectric part being located between at least part of the third conductive part and the third electrode in the second direction,
the plurality of third structure sections are spaced from the plurality of first structure sections and the plurality of second structure sections in the first direction,
position in the first direction of one of the plurality of first structure sections is located between position in the first direction of one of the plurality of second structure sections and position in the first direction of one of the plurality of third structure sections, and
pitch along the first direction of the plurality of third structure sections is shorter than the pitch along the first direction of the plurality of first structure sections.

11. The transducer according to claim 10, wherein the plurality of third structure sections are arranged in the first direction.

12. The transducer according to claim 10, wherein the plurality of third structure sections are arranged in a direction crossing a plane including the first direction and the second direction.

13. The transducer according to claim 10, wherein direction from the plurality of first structure sections to the plurality of third structure sections lies along the first direction.

14. An inspection device comprising:
a first transducer including:
a plurality of first structure sections spaced from each other in a first direction, part of each of the plurality of first structure sections being fixed, the each of the plurality of first structure sections including:
a first membrane part;
a first piezoelectric part;
a first conductive part provided between at least part of the first membrane part and the first piezoelectric part in a second direction crossing the first direction; and
a first electrode, at least part of the first piezoelectric part being located between at least part of the first conductive part and the first electrode in the second direction; and
a plurality of second structure sections spaced from each other in the first direction, part of each of the plurality of second structure sections being fixed, each of the plurality of second structure sections including:
a second membrane part;
a second piezoelectric part;
a second conductive part provided between at least part of the second membrane part and the second piezoelectric part in the second direction; and
a second electrode, at least part of the second piezoelectric part being located between at least part of the second conductive part and the second electrode in the second direction,
the plurality of second structure sections being spaced from the plurality of first structure sections in the first direction, and pitch along the first direction of the plurality of second structure sections being shorter than pitch along the first direction of the plurality of first structure sections;
a second transducer spaced from the first transducer in the second direction; and
a transport section provided between the first transducer and the second transducer.

15. The device according to claim 14, wherein
the first transducer further includes a plurality of third structure sections,
each of the plurality of third structure sections includes:
a third membrane part;
a third piezoelectric part;
a third conductive part provided between at least part of the third membrane part and the third piezoelectric part in the second direction; and
a third electrode, at least part of the third piezoelectric part being located between at least part of the third conductive part and the third electrode in the second direction,
the plurality of third structure sections are spaced from the plurality of first structure sections and the plurality of second structure sections in the first direction,
position in the first direction of one of the plurality of first structure sections is located between position in the first direction of one of the plurality of second structure sections and position in the first direction of one of the plurality of third structure sections, and
pitch along the first direction of the plurality of third structure sections is shorter than the pitch along the first direction of the plurality of first structure sections.

16. The device according to claim 14, wherein the second transducer includes:
- a plurality of fourth structure sections spaced from each other in the first direction, part of each of the plurality of fourth structure sections being fixed, each of the plurality of fourth structure sections including:
  - a fourth membrane part;
  - a fourth piezoelectric part;
  - a fourth conductive part provided between at least part of the fourth membrane part and the fourth piezoelectric part in the second direction; and
  - a fourth electrode, at least part of the fourth piezoelectric part being located between at least part of the fourth conductive part and the fourth electrode in the second direction; and
- a plurality of fifth structure sections spaced from each other in the first direction, part of each of the plurality of fifth structure sections being fixed, each of the plurality of fifth structure sections including:
  - a fifth membrane part;
  - a fifth piezoelectric part;
  - a fifth conductive part provided between at least part of the fifth membrane part and the fifth piezoelectric part in the second direction; and
  - a fifth electrode, at least part of the fifth piezoelectric part being located between at least part of the fifth conductive part and the fifth electrode in the second direction,
- the plurality of fifth structure sections being spaced from the plurality of fourth structure sections in the first direction, and pitch along the first direction of the plurality of fifth structure sections being shorter than pitch along the first direction of the plurality of fourth structure sections.

17. The device according to claim 16, wherein
the second transducer further includes a plurality of sixth structure sections,
each of the plurality of sixth structure sections includes:
- a sixth membrane part;
- a sixth piezoelectric part;
- a sixth conductive part provided between at least part of the sixth membrane part and the sixth piezoelectric part in the second direction; and
- a sixth electrode, at least part of the sixth piezoelectric part being located between at least part of the sixth conductive part and the sixth electrode in the second direction, the plurality of sixth structure sections are spaced from the plurality of fourth structure sections and the plurality of fifth structure sections in the first direction,
position in the first direction of one of the plurality of fourth structure sections is located between position in the first direction of one of the plurality of fifth structure sections and position in the first direction of one of the plurality of sixth structure sections, and
pitch along the first direction of the plurality of sixth structure sections is shorter than the pitch along the first direction of the plurality of fourth structure sections.

\* \* \* \* \*